United States Patent
Huang et al.

(10) Patent No.: US 9,786,857 B2
(45) Date of Patent: Oct. 10, 2017

(54) FLOATING-GATE TRANSISTOR PHOTODETECTOR

(71) Applicant: NUtech Ventures, Lincoln, NE (US)

(72) Inventors: Jinsong Huang, Lincoln, NE (US); Yongbo Yuan, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 2 days.

(21) Appl. No.: 15/091,201

(22) Filed: Apr. 5, 2016

(65) Prior Publication Data

US 2016/0285020 A1    Sep. 29, 2016

Related U.S. Application Data

(62) Division of application No. 14/214,513, filed on Mar. 14, 2014, now Pat. No. 9,331,293.

(60) Provisional application No. 61/783,108, filed on Mar. 14, 2013.

(51) Int. Cl.
| | |
|---|---|
| *H01L 31/113* | (2006.01) |
| *H01L 51/42* | (2006.01) |
| *H01L 51/00* | (2006.01) |
| *H01L 51/05* | (2006.01) |
| *H01L 51/44* | (2006.01) |

(52) U.S. Cl.
CPC ........ *H01L 51/428* (2013.01); *H01L 31/1136* (2013.01); *H01L 51/0052* (2013.01); *H01L 51/0074* (2013.01); *H01L 51/055* (2013.01); *H01L 51/0545* (2013.01); *H01L 51/447* (2013.01); *Y02E 10/549* (2013.01)

(58) Field of Classification Search
CPC ............. H01L 31/1136; H01L 51/0052; H01L 51/428; Y02E 10/549
See application file for complete search history.

(56) References Cited

U.S. PATENT DOCUMENTS

| | | | | |
|---|---|---|---|---|
| 2007/0063304 A1* | 3/2007 | Matsumoto | ............ | B82Y 10/00 257/462 |
| 2010/0155707 A1* | 6/2010 | Anthopoulos | ......... | B82Y 10/00 257/40 |
| 2013/0049738 A1 | 2/2013 | Sargent | | |

OTHER PUBLICATIONS

Agostinelli et al., "A polymer/fullerene based photodetector with extremely low dark current for x-ray medical imaging applications," *Applied Physics Letters*, 2008, 93(20).

Arnold et al., "Broad Spectral Response Using Carbon Nanotube/Organic Semiconductor/C(60) Photodetectors," *NANO Letters*, 2009, 9(9):3354-3358.

(Continued)

*Primary Examiner* — Francis M Legasse, Jr.
(74) *Attorney, Agent, or Firm* — Fish & Richardson P.C.

(57) ABSTRACT

A field effect transistor photodetector that can operate in room temperature includes a source electrode, a drain electrode, a channel to allow an electric current to flow between the drain and source electrodes, and a gate electrode to receive a bias voltage for controlling the current in the channel. The photodetector includes a light-absorbing material that absorbs light and traps electric charges. The light-absorbing material is configured to generate one or more charges upon absorbing light having a wavelength within a specified range and to hold the one or more charges. The one or more charges held in the light-absorbing material reduces the current flowing through the channel.

8 Claims, 14 Drawing Sheets

(56) References Cited

OTHER PUBLICATIONS

Christ et al., "Nanosecond response of organic solar cells and photodetectors," *Journal of Applied Physics*, 2009, 105(10):104513, 10 pages.

Das and Harrop, *Printed, Organic & Flexible Electronics Forecasts, Players & Opportunities* 2010-2020, 2010, retrieved Jun. 27, 2014, "http://www.idtechex.com/research/reports/printed_organic_and_flexible_electronics_forecasts_players_and_opportunities_2010_2020_000238.asp," 10 pages.

Fleissner et al., "Trap-controlled hole transport in small molecule organic semiconductors," *Applied Physics Letters*, 2007, 91(24): 3 pages.

Fujiwara and Sasaki, "Multiphoton discrimination at telecom wavelength with charge integration photon detector," *Applied Physics Letters*, 2005, 86:111119, 4 pages.

Gansen et al., "Operational analysis of a quantum dot optically gated field-effect transistor as a single-photon detector," *IEEE Journal of Selected Topics in Quantum Electronics*, 2007, 13(4):967-977.

Gansen et al., Photon-number-discriminating detection using a quantum-dot, optically gated, field-effect transistor, *Nature Photonics*, 2007, 1(10):585-588.

Gol'Tsman et al., "Picosecond superconducting single-photon optical detector," *Applied Physics Letters*, 2001, 79(6):705-707.

Gong et al., "High-detectivity polymer photodetectors with spectral response from 300 nm to 1450 nm," *Science*, 2009, 325(5948):1665-1667.

Hertz, "Ueber einen Einfluss des ultravioletten Lichtes auf die electrische Entladung," *Annalen der Physik*, 1987, 267(8):983.

Hiskett et al., "Performance and design of InGaAs/InP photodiodes for single-photon counting at 1.55 μm," *Applied Optics*, 2000, 39(36):6818-6829.

Hu et al., "Superconducting nanowire single-photon detectors integrated with optical nano-antennae," *Optics Express*, 2011, 19(1):17-31.

Jin et al., "Solution-processed ultraviolet photodetectors based on colloidal ZnO nanoparticles," *Nano letters*, 2008, 8(6):1649-1653.

Kalb et al., "Trap density of states in small-molecule organic semiconductors: a quantitative comparison of thin-film transistors with single crystals," *Physical Review B*, 2010, 81:155315, 13 pages.

Kim et al., "Multiphoton detection using visible light photon counter," *Applied Physics Letters*, 1999, 74:902-904.

Kwiat et al., "High-efficiency single-photon detectors," *Rapid Communications: Physical Review A*, 1993, 48(2):867-870.

Lao et al., "Giant enhancement in UV response of ZnO nanobelts by polymer surface-functionalization," *Journal of the American Chemical Society*, 2007, 129(40):12096-12097.

Lee et al., "High efficiency organic multilayer photodetectors based on singlet exciton fission," *Applied Physics Letters*, 2009, 95(3): 033301-1, 4 pages.

Lin et al., "Highly efficient visible-blind organic ultraviolet photodetectors," *Advanced Materials*, 2005, 17(20):2489.

Marino et al., "A compact 3D imaging laser radar system using Geiger-mode APD arrays- System and measurements," *Proceedings of SPIE*, 2003, 5086:15 pages.

Miller et al., "Demonstration of a low-noise near-infrared photon counter with multiphoton discrimination," *Applied Physics Letters*, 2003, 83(4):791-793.

Morimune et al., "High-speed organic photodetectors using heterostructure with phthalocyanine and perylene derivative," *Japanese Journal of Applied Physic Part 1—Regular papers Brief Communications & Review Papers*, 2006, 45(1B):546-549.

Peumans et al., "Small molecular weight organic thin-film photodetectors and solar cells," *Journal of Applied Physics*, Apr. 2003, 93(7):3693-3723.

Rowe et al., "Analysis of photoconductive gain as it applies to single-photon detection," *Journal of Applied Physics*, 2010, 107(6): 063110-1, 6 pages.

Rowe et al., "Single-photon detection using a quantum dot optically gated field-effect transistor with high internal quantum efficiency," *Applied Physics Letters*, 2006, 89(25):253505, 4 pages.

Semenov et al., "Intrinsic quantum efficiency and electro-thermal model of a superconducting nanowire single-photon detector," *Journal of Modern Optics*, 2009, 56(2-3):345, 8 pages.

Sidhu et al., "GaAsSb resonant-cavity enhanced avalanche photodiode operating at 1.06 μm," *Electronics Letters*, 2004, 40(20):220-221.

Soci et al., "ZnO nanowire UV photodetectors with high internal gain," *NANO Letters*, 2007, 7(4):1003-1009.

Tseng et al., "Nanoparticle-induced negative differential resistance and memory effect in polymer bistable light-emitting device," *Applied Physics Letters*, 2006, 88(12):123506, 3 pages.

Woodard et al., "Photon counting using a large area avalanche photodiode cooled to 100K," *Applied Physics Letters*, 1994, 64(10):1177-1179.

Yao et al., "Plastic near-infrared photodetectors utilizing low band gap polymer," *Advanced Materials*, 2007, 19(22):3979-3983.

Yuan et al., "Solution-Processed Nanoparticle Super-Float-Gated Organic Field-Effect Transistor as Un-cooled Ultraviolet and Infrared Photon Counter," *Scientific Reports*, Sep. 19, 2013, 3:2707, 7 pages.

Zhang et al., "Highly efficient photovoltaic diode based organic ultraviolet photodetector and the strong electroluminescence resulting from pure exciplex emission," *Organic Electronics*, 2009, 10(2):352-356.

Zimmerman et al., "Porphyrin-Tape/C(60) Organic Photodetectors with 6.5% External Quantum Efficiency in the Near Infrared," *Advanced Materials*, 2010, 22(25):2780-2783.

\* cited by examiner

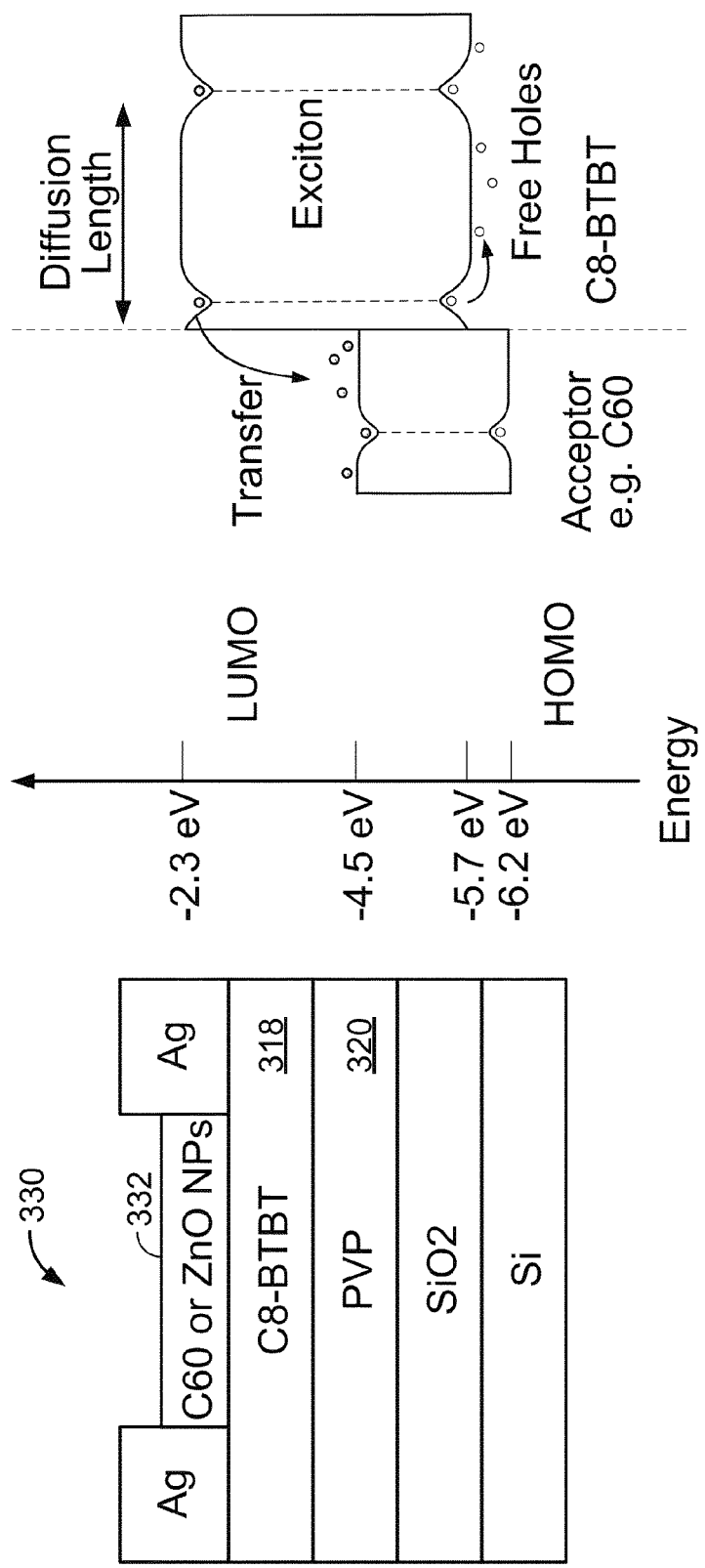

US 9,786,857 B2

FLOATING-GATE TRANSISTOR PHOTODETECTOR

CROSS REFERENCE TO RELATED APPLICATIONS

This application is a divisional application of U.S. patent application Ser. No. 14/214,513, filed on Mar. 14, 2014, which claims priority to U.S. Provisional Patent Application 61/783,108, filed on Mar. 14, 2013. The contents of the above applications are incorporated by reference in their entirety.

TECHNICAL FIELD

This disclosure relates to floating-gate transistor photodetectors.

BACKGROUND

High sensitivity photodetectors and photon counters with a resolution at the photon level are useful in many civilian and military applications, including quantum cryptography, imaging at low levels of ambient illumination, light detection and ranging (LIDAR), space exploration, and medical imaging. Examples of highly sensitive photodetectors include photomultiplier tubes (PMTs), avalanche photodiodes (APDs), and quantum dot single-photon detectors (QDSPD). Nanomaterials, such as lead sulfide colloidal quantum dots, cadmium selenide colloidal nano-particles, and zinc oxide (ZnO) nano-particles and nanowires, have been used in the photodetectors.

SUMMARY

In general, in one aspect, a new type of solution-processed organic field-effect transistor (OFET) as a highly sensitive un-cooled photodetector is provided. The OFET integrates ZnO nano-particles positioned between two dielectric layers under the channel layer, and uses the photo-generated, confined electrons to tune the channel current. A large photoconductive gain and photon number memorizing and counting capability are enabled by a novel super-float-gating mechanism. For example, a detectable ultraviolet light intensity of 2.6 photons/$\mu m^2 s$ ($1.5 \times 10^{-10}$ W/cm$^2$) can be achieved.

In general, in another aspect, a field effect transistor photodetector is provided. The photodetector includes a source electrode, a drain electrode, a channel to allow an electric current to flow between the drain and source electrodes, and a gate electrode to receive a bias voltage for controlling the current in the channel. The photodetector includes a light-absorbing material that absorbs light and traps electric charges, in which the light-absorbing material is configured to generate one or more charges upon absorbing light having a wavelength within a specified range and to hold the one or more charges, and in which the one or more charges held in the light-absorbing material reduces the current flowing through the channel.

In general, in another aspect, a transistor photodetector includes a source electrode, a drain electrode, a channel layer to allow an electric current to flow between the drain and source electrodes, a gate electrode, a light-absorbing layer made of a material that absorbs light and traps charges, the light-absorbing layer being disposed between the channel layer and the gate electrode, a first dielectric layer disposed between the channel layer and the light-absorbing layer, and a second dielectric layer disposed between the gate electrode and the light-absorbing layer.

In general, in another aspect, a field effect transistor photodetector includes a source electrode, a drain electrode, a channel to allow an electric current to flow between the drain and source electrodes, a gate electrode to receive a bias voltage for controlling the current in the channel, a dielectric layer disposed between the gate electrode and the channel, and a window to allow light to illuminate the channel. The channel layer includes a light-absorbing material that absorbs light and traps electric charges when a bias voltage is applied to the gate electrode. The light-absorbing material is configured to generate one or more charges upon absorbing light having a wavelength within a specified range and to confine the one or more charges. The one or more charges held in the light-absorbing material increases the current flowing through the channel.

In general, in another aspect, a method of detecting photons includes applying a voltage difference between a source electrode and a drain electrode, and applying a bias voltage to a gate electrode, to cause an electric current to flow from the source electrode through a channel to the drain electrode; generating one or more electric charges by using a light-absorbing material to absorb light and generate the one or more electric charges; trapping the one or more electric charges within the light-absorbing material; and reducing the current flowing in the channel by using the trapped one or more electric charges in the light-absorbing material to influence charge carriers in the channel.

In general, in another aspect, a method of detecting photons is provided. The method includes providing a field effect transistor photodetector that includes a source electrode, a drain electrode, a channel having a light-absorbing material, a gate electrode, and a dielectric layer disposed between the gate electrode and the channel. The method includes applying a voltage difference between the source and drain electrodes; applying a bias voltage to the gate electrode, in which initially negligible current flows in the channel when the bias voltage is applied to the gate electrode; generating one or more electric charges in the channel by using the light-absorbing material in the channel to absorb light and generate the one or more electric charges; confining the one or more electric charges in the channel; and increasing a current flowing in the channel upon confining the charges in the channel.

Other aspects include other combinations of the features recited above and other features, expressed as methods, apparatus, systems, and in other ways.

Advantages of the aspects and implementations may include one or more of the following. The photodetectors can have high detectivity, operate in room temperature without complicated cooling equipment, high resolution, good flexibility, integration with silicon technology, higher yield, and lower manufacturing/operating costs.

DESCRIPTION OF DRAWINGS

FIG. 8A is a diagram of a double active layer structure with p-n heterojunction.

FIG. 8B is an energy diagram of the materials in the device of FIG. 8A.

Like reference symbols in the various drawings indicate like elements.

DETAILED DESCRIPTION

This disclosure describes a field effect transistor photodetector that uses a light-absorbing, charge-confining material to absorb light and generate charges that are confined within the material, and uses the confined charges to influence charged carriers in the channel of the transistor to reduce the current flowing the channel. The amount of change of the channel current is dependent on the amount of charges confined in the light-absorbing, charge-confining material, and the amount of charges in the material is dependent on the number of photons that have been absorbed. There is a relationship between the amount of change in the channel current and the number of photons absorbed. Thus, it is possible to count the number of photons detected by measuring the amount of change in the channel current.

Figure 1B:
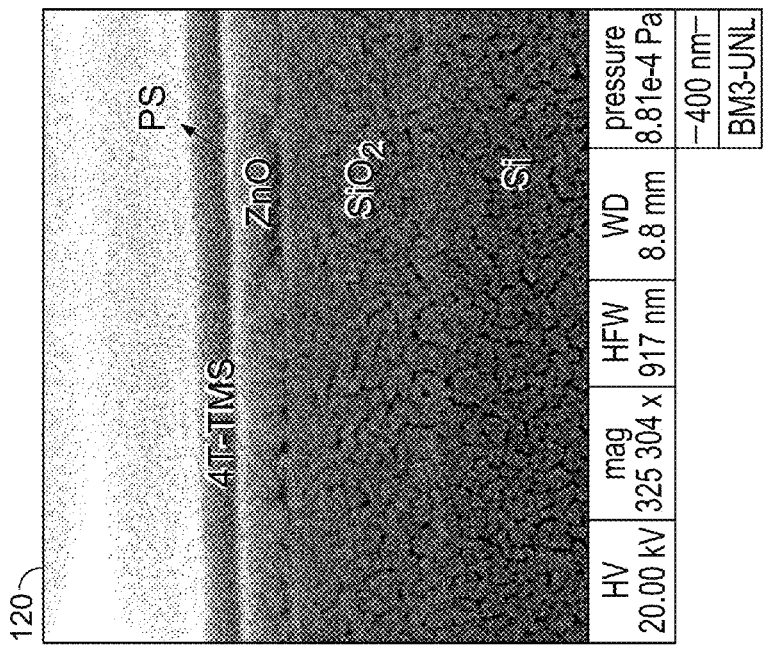
FIG. 1B is an SEM cross-section image of the FET photodetector.
Figure 1A:
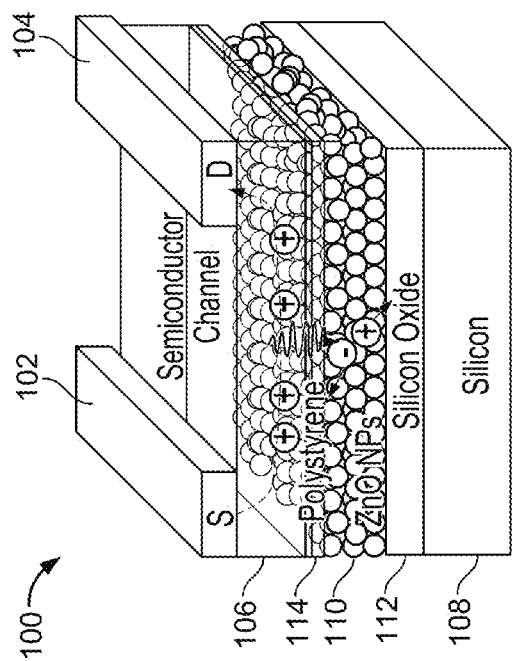
FIG. 1A is a diagram of the structure of a field effect transistor photodetector.

Referring to FIG. 1A, in some implementations, a field effect transistor photodetector 100 includes a bottom-gate, top-contact type organic field effect transistor. The transistor includes a source electrode 102, a drain electrode 104, a channel 106, and a gate electrode 108. The source and drain electrodes can be made of a conductive material, such as metal or indium tin oxide. In this example, a highly doped silicon wafer is used as both the substrate and the gate electrode. The gate electrode can also be made of other conductive or semi-conductive materials, such as indium tin oxide. A photoactive layer 110 is positioned between a first dielectric layer 112 and a second dielectric layer 114. In the example of FIG. 1A, the photoactive layer 110 is made of zinc oxide (ZnO), but the photoactive layer 110 can also be made of other materials, such as lead sulfide. The material in the photoactive layer 110 can be in the form of e.g., nano-particles, nano-wires, but is not limited to these forms. More than one type of photoactive material can be used. Two or more photoactive materials can be mixed together or be in separate layers. The photosensitive material(s) can be selected based on the wavelength of light to be detected. For example, zinc oxide can be used in a sensor for detecting UV photons, and lead sulfide can be used in a sensor for detecting infrared and visible light photons. A sensor having both zinc oxide and lead sulfide can detect light ranging from UV to infrared wavelengths. The photoactive layer 110 can have a thickness in a range from, e.g., 1 nm to several hundred nanometers, but other thicknesses can also be used.

The bottom dielectric layer 112 can be a thermal growth silicon oxide ($SiO_2$) layer having a thickness of 200 nm. The top dielectric layer 114 can be a thin layer of polystyrene (PS). In the example of FIG. 1A, the channel layer 106 is an organic semiconductor layer made of either trimethyl-[2,]quarter-thiophen-5-yl-silane (4T-TMS) or pentacene. Other materials, such as graphene, can also be used for the channel layer. The thin polystyrene dielectric layer can be formed by the vertical phase separation of a 4T-TMS:PS blend after drop coating. The polystyrene layer 114 forms an energy barrier between the photoactive layer 110 and the semiconductor channel layer 106 so that the charges in the photoactive layer 110 does not migrate to the channel layer 106.

FIG. 1B shows a scanning electron microscope (SEM) cross-section image 120 of a field effect transistor photodetector. The ZnO nano-particle layer, the polystyrene layer, and 4T-TMS layer can be identified in the image 120. The optical response spectrum of the sensor is determined by the ZnO nano-particle layer.

Figure 1C:
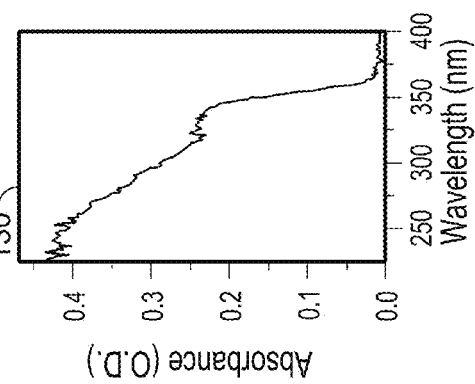
FIG. 1C is a graph showing the absorption spectrum of the ZnO nano-particle photoactive layer.

FIG. 1C is a graph 130 showing the absorption spectrum of the ZnO nano-particle layer having a thickness of 60 nm, in which an optical band gap of 3.4 eV for the ZnO nano-particles can be identified. The thickness of the polystyrene layer was controlled to be around 10 nm. The thickness of the polystyrene layer can be adjusted by changing the ratio of the 4T-TMS:PS blend.

Figure 1D:
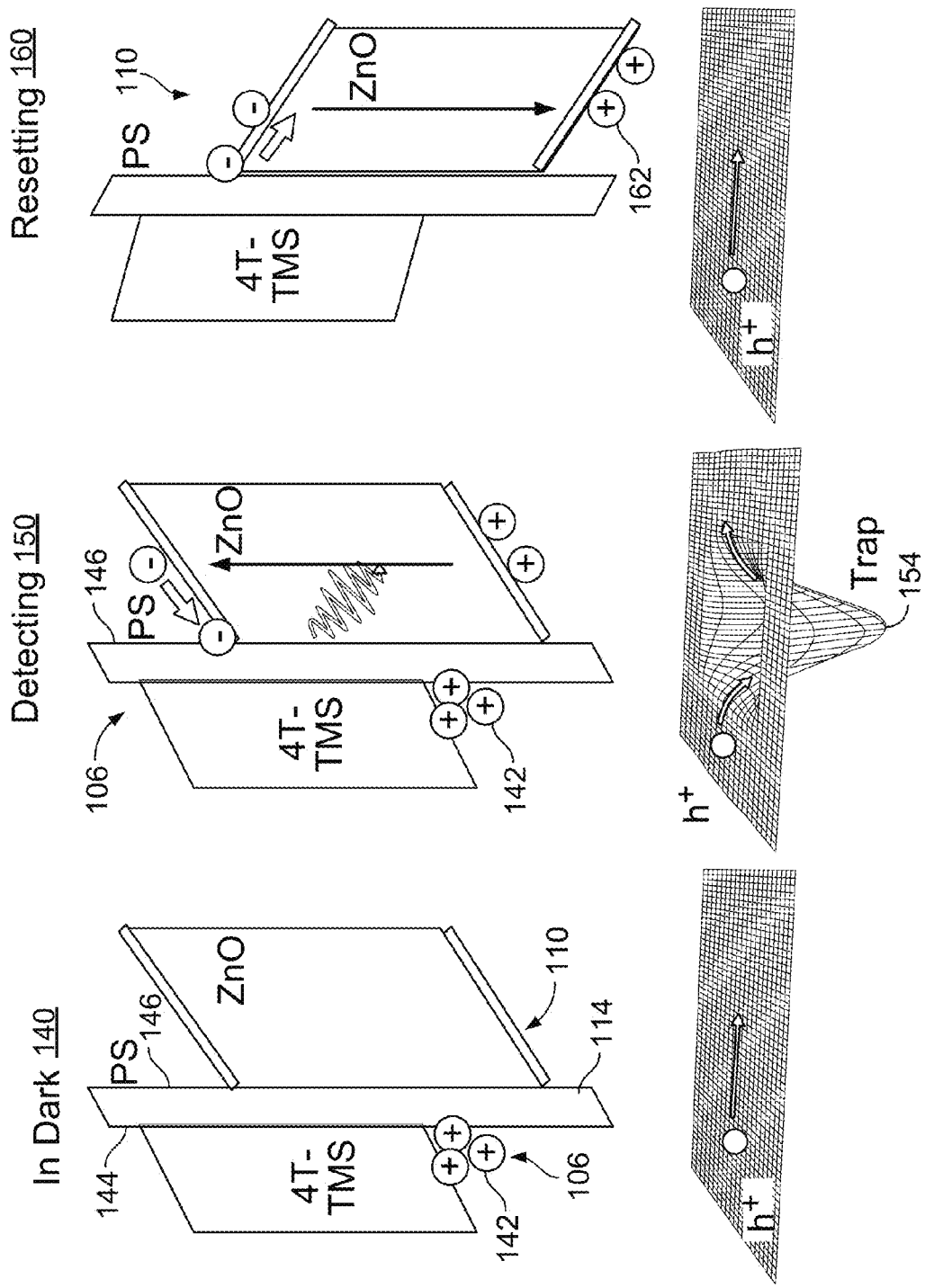
FIG. 1D is a diagram showing the detecting and resetting processes of the FET photodetector.

Referring to FIG. 1D, the working process of the field effect transistor photodetector 100 can be described in three stages. The photodetector 100 works when the transistor is in the ON state. In an initial first stage 140, the sensor 100 is in the dark, the ZnO nano-particle layer and the polystyrene layer, acts as insulating dielectric layers. The holes 142 injected from the source electrode 102 are built up at the 4T-TMS/PS interface 144 because of the insulating property of the polystyrene and the large energy difference between the highest occupied molecular orbital (HOMO) of 4T-TMS (−5.3 eV) and the valence band of ZnO (−7.6 eV). Driven by the source-drain voltage, the carriers transport laterally to the drain electrode 104.

In a detecting stage 150, the photodetector 100 absorbs one or more photons. The absorption of UV photons by 4T-TMS and polystyrene is small due to their large band gap and small thickness. Incident UV photons excite electron-hole pairs in the ZnO nano-particle layer 110. A negative bias voltage is applied to the gate electrode 108, which causes the electrons to sweep crossing the ZnO nano-particles layer 110 and be confined at the ZnO/PS interface 146. The confined electrons 152 at the ZnO/PS interface 146 impose a trapping effect to the transporting hole carriers 142 in the nearby semiconductor channel 106 by columbic attraction, and thus results in a reduced source-drain output current ($\Delta I_{SD}$) in the organic field effect transistor. The trapping effect is represented by a trap 154 in the diagram. The reduction in the source-drain output current $\Delta I_{SD}$ is correlated to the density of photo-generated confined electrons 152 at the ZnO/PS interface 146, and thus that of incident light intensity.

The confined electrons in the ZnO layer influence the current flowing through the channel. In this case, the confined electrons reduce the amount of current flowing through the channel. Thus, the ZnO layer functions as a "floating gate." As described below, the trapping effect generated by the confined electrons causes the channel current to decrease exponentially in relation to the amount of photons absorbed by the ZnO layer, thus the ZnO layer is referred to as an "enhanced floating-gate" mechanism.

The confined electrons 152 at the ZnO/PS interface 146 can be held for a long time (e.g., several minutes) by the applied gate electric field without recombination. Thus, the reduction in the source-drain current $\Delta I_{SD}$ persists even after the incident light is turned off. This is one of the differences between the field effect transistor photodetector 100 and conventional photoconductor or diodes in which the current signal decays quickly once the light is turned off. In the field effect transistor photodetector, the reduction in the source-drain current $\Delta I_{SD}$ is determined by the amount of absorbed photons rather than the intensity of the light, so that the device works in a photon-counting mode.

The photodetector 100 can operate as a photon counter that counts incident photons continuously, and can be reset by a reversed gate bias pulse. In a resetting stage 160, a reverse bias voltage is applied to the gate electrode 108, which causes the electrons 152 at the ZnO/PS interface 146 to move toward the holes 162 in the ZnO nano-particle layer 110 and recombine with them. As a result, the photon-induced traps disappear and the channel current resumes its initial value.

Figure 2A:
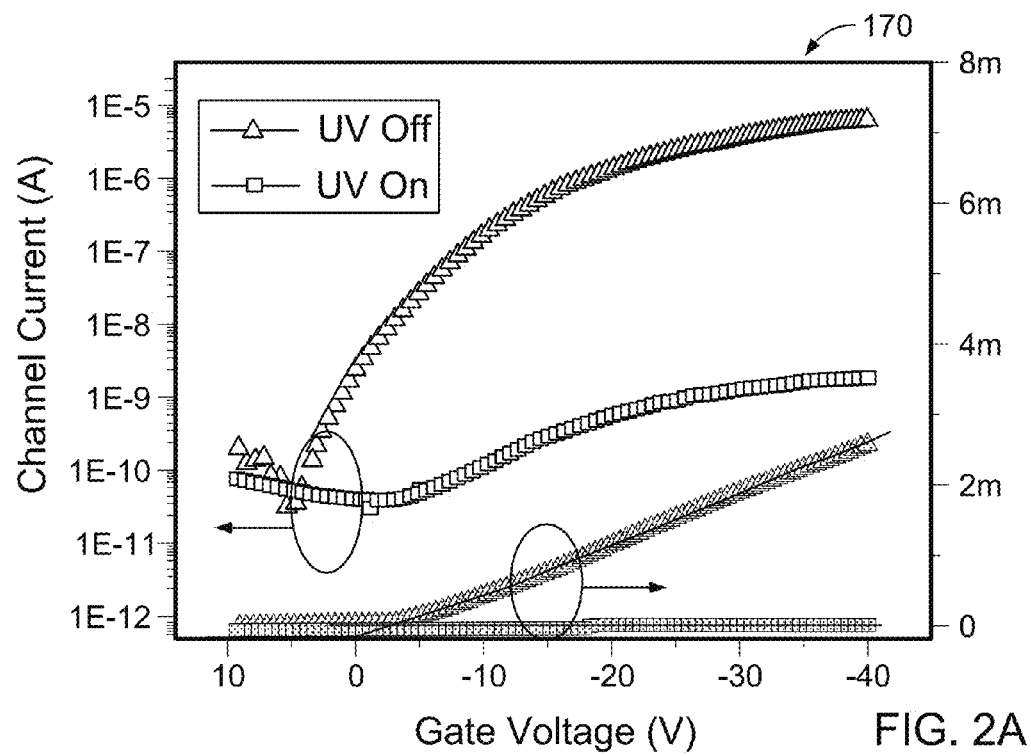
FIG. 2A is a graph showing the transfer characteristics of the FET photodetector in the dark (red) and under UV illumination (blue).

FIG. 2A is a graph 170 showing example transfer curves of the field effect transistor photodetector 100 in the dark and under UV illumination. The layer of ZnO nano-particles is covered with a thin layer of polystyrene for a number of reasons. One of functions of the polystyrene layer is to flatten and encapsulate the surface of the ZnO nano-particle layer so that the hole carriers are not trapped by the surface defects on the ZnO nano-particles and the field effect transistor photodetector can work as a normal transistor device in the dark. The calculated hole mobility of the 4T-TMS-based transistor in the dark is about 0.065 cm$^2$/Vs. When the field effect transistor photodetector was illuminated by UV light, the channel current dropped immediately. No channel current change was observed when the channel region was illuminated by visible light (400~700 nm), which confirms that the current variation of the field effect transistor was caused by the absorption of UV light by the large band gap of ZnO nano-particles.

Figure 2B:
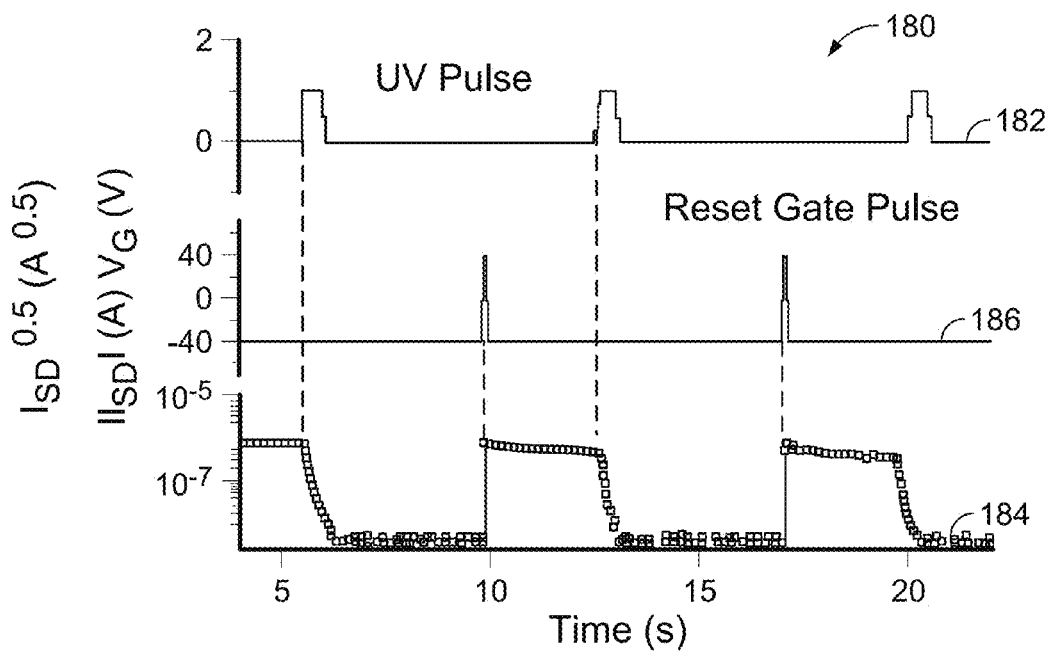
FIG. 2B is a graph showing the FET photodetector detecting UV pulses and being reset using positive gate voltage pulses.

The photon detecting and resetting of the field effect transistor photodetector was demonstrated by recording the $\Delta I_{SD}$ under the illumination of a train of UV light pulses, which was followed by a reversed gate bias pulse after each light pulse. Referring to FIG. 2B, a graph 180 shows a UV light pulse 182 with a duration of 0.5 seconds caused a change in drain-source current $\Delta I_{SD}$ 184 from 700 nA to 5 nA. A reverse bias pulse 186 having about 40 ms pulse width is applied to recover the drain-source current $I_{SD}$ to its initial value so that the field effect transistor photodetector 100 has an "optical write/electrical reset" working process. The field effect transistor photodetector 100 can also be partially reset by just turning off the gate voltage, because turning off the gate bias releases the confined electrons to the ZnO layer. An additional positive gate voltage leads to a fast and complete resetting. The detector shows increased resistance (decreased current) by illumination, which can be measured by (i) read-out circuits with mirror circuit scheme for the current cancellation, or (ii) read-out circuits that can convert the device resistance change to voltage output change.

Figure 2C:
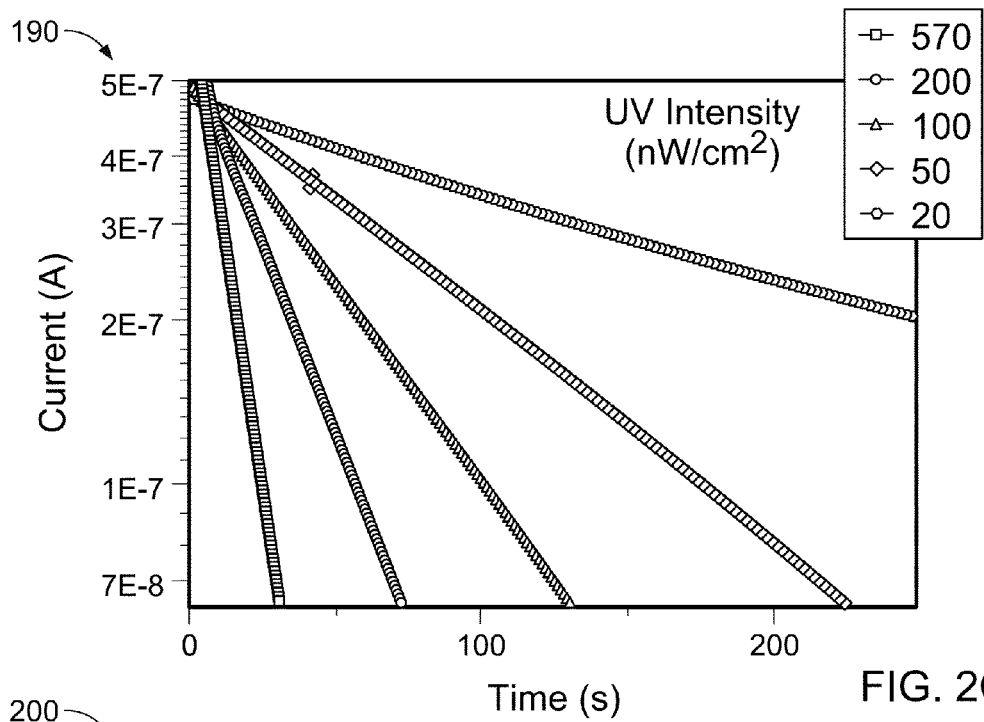
FIG. 2C is a graph showing exponential channel current decay of the FET photodetector illuminated by various UV light intensities.

Referring to FIG. 2C, to evaluate the sensitivity and linear dynamic range of the field effect transistor photodetector 100, the variations of $I_{SD}$ under different UV light intensity were studied, where the different UV light intensities were generated by a gallium nitride (GaN) light emitting diode (LED) (emission peak at 345 nm) and attenuated with a set of neutral density filters. As shown in graph 190, under a constant UV light intensity, the $I_{SD}$ decreased exponentially with time because the FET photodetector continued to absorb and count photons. A stronger UV intensity results in a faster decay rate (decay rate is defined as $k_{SD}$=d log($\Delta I_{SD}$)/dt). There is a background $I_{SD}$ decay of the FET photodetector in the dark, whose fluctuation determines the lowest light intensity that can be measured (or noise equivalent power, (NEP)).

Figure 2D:
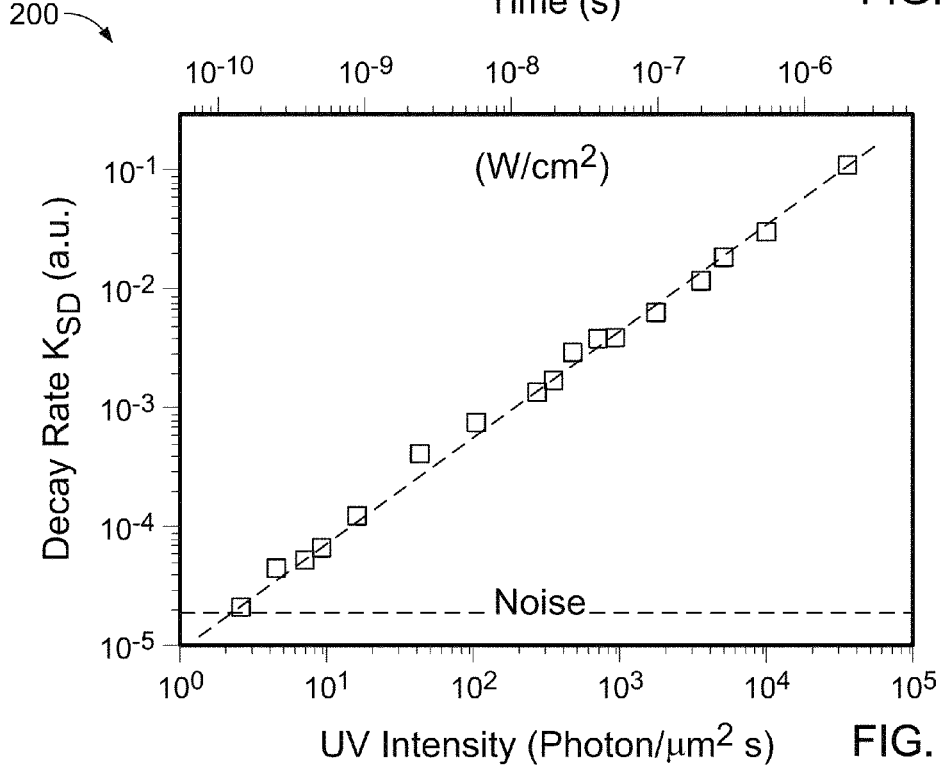
FIG. 2D is a graph showing the channel current decay rate as a function of the incident light intensity ranging from 2.6 photons/$\mu m^2 s$ to $3.5 \times 10^4$ photons/$\mu m^2 s$.

Referring to FIG. 2D, for a better understanding of the relationship between the current decay rates and the UV light intensity, we plotted the $k_{SD}$ obtained as a function of the UV intensity, as shown in graph 200. The $k_{SD}$ linearly increases with the incident UV light intensity in over four orders of magnitude from 2.6 photons/µm²s to 3.5×10⁴ photons/µm²s.

Figure 2E:
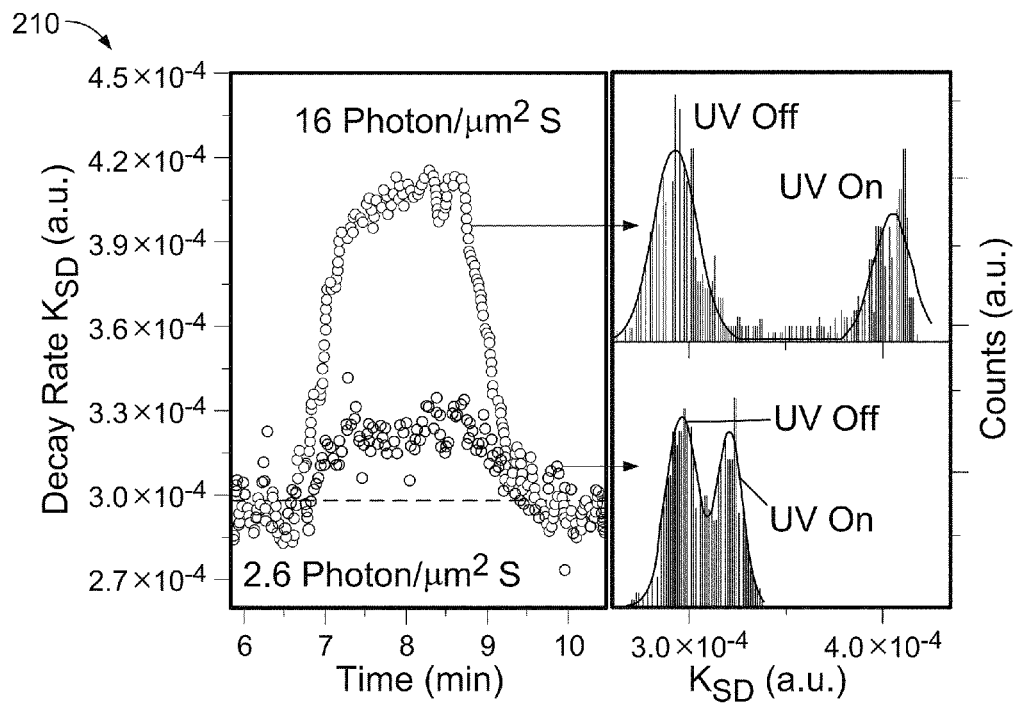
FIG. 2E includes a graph showing the decay rate of the FET photo sensor at a weak UV power intensity of 2.6 photons/$\mu m^2 s$ and 16 photons/$\mu m^2 s$, respectively. Also shown is a graph showing the histograms of the current decay rate at the corresponding UV light intensities.

Referring to FIG. 2E, a graph 210 shows the $k_{SD}$ of the field effect transistor photodetector under a rectangular UV light pulse having a light intensity of 2.6 photons/µm²s and 16 photons/µm²s, respectively, demonstrating the capability of the photodetector in weak light detecting. The distribution of the current decay rate in the dark or under weak UV light (2.6 photons/µm²s and 16 photons/µm²s, respectively) is shown in FIG. 2E. In some examples, at the minimum detectable power intensity level, the photodetector performs an integration for several seconds (e.g., tens of seconds) to distinguish the signal from noise (corresponding to about 100 photons/µm²). The minimum detectable light intensity for the FET photodetector can be very low because of the high gain from the enhanced floating-gate mechanism. The high sensitivity of the photodetector can be attributed to the large photoconductive gain (the result of a sufficient supply of charges provided by the source electrode) and the current change due to the photo-induced conductivity change. The long recombination lifetime of the confined electrons can induce a large gain in the FET photodetector.

Figure 2F:
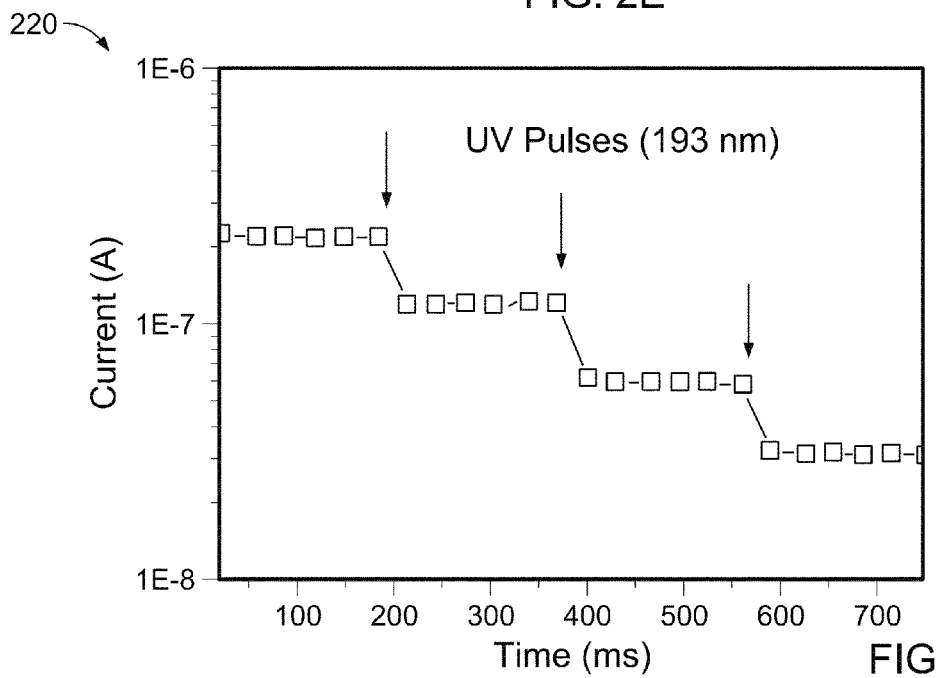
FIG. 2F is a graph showing continuous photon counting of the FET photodetector illuminated by UV (193 nm) pulses having a pulse width of 12 nanosecond and interval of 200 ms.

Referring to FIG. 2F, to demonstrate the light-pulse-counting capability of the FET photodetector, the $\Delta I_{SD}$ under a train of nano-second UV pulses was recorded and shown in a graph 220. The UV light pulse train, with a pulse width of 12 ns and an interval of 200 ms, was generated by an excimer UV laser (BraggStar Industrial LN 1000). Since no recovery period is required after each photon event, the FET photodetector 100 can count photons continuously without dead time. The $I_{SD}$ decreases step by step upon each incident light pulse, and the $I_{SD}$ keeps constant between each light pulse. This unique device behavior enables the counting of light pulses with a single device without sophisticated electronics, which may be useful in optical communication applications. In this example, the device response time is shorter than 30 ms, which is limited by our current measurement system. The unique "memory" function of the FET photodetector 100 enables the separation of light detection and signal readout so that the electronics do not need to have a quick read out speed, which can be important in applications where the total incident photon numbers are concerned, such as radiation detection.

The following describes the gating mechanism of the FET photodetector 100. The large photoconductive gain in the FET photodetector 100 generates a large signal output ($\Delta I_{SD}$) per incident photon and enables the weak light detection near the single-photon level. A linear variation of transistor output current with the incident photons can be expected if the charged ZnO nano-particles only function as a floating gate to tune the apparent gate bias to the semiconductor layer:

$$\Delta I_{SD} = g_m \frac{qD}{\varepsilon} N_{ph} \quad \text{(Equ. 1)}$$

where $g_m$ is the transconductance of the transistor at a fixed gate bias, q is the element charge, D is the distance between the gate and the photon absorption layer, s is the electric permittivity of the space materials, and $N_{ph}$ is number of absorbed photons. However, the FET photodetector 100 has an exponential dependence of $\Delta I_{SD}$ with the amount of absorbed photons: $\Delta I_{SD} \propto \exp(-N_{ph})$. It is then expected that the charged ZnO nano-particles near the 4T-TMS/PS interface have other roles in addition to their function as a floating gate to change the effective gate bias. To better understand the high sensitivity of the FET photodetector 100 at room temperature, the following is a device model that can be used to explain the exponential decrease of the current under constant illumination.

Figure 3A:
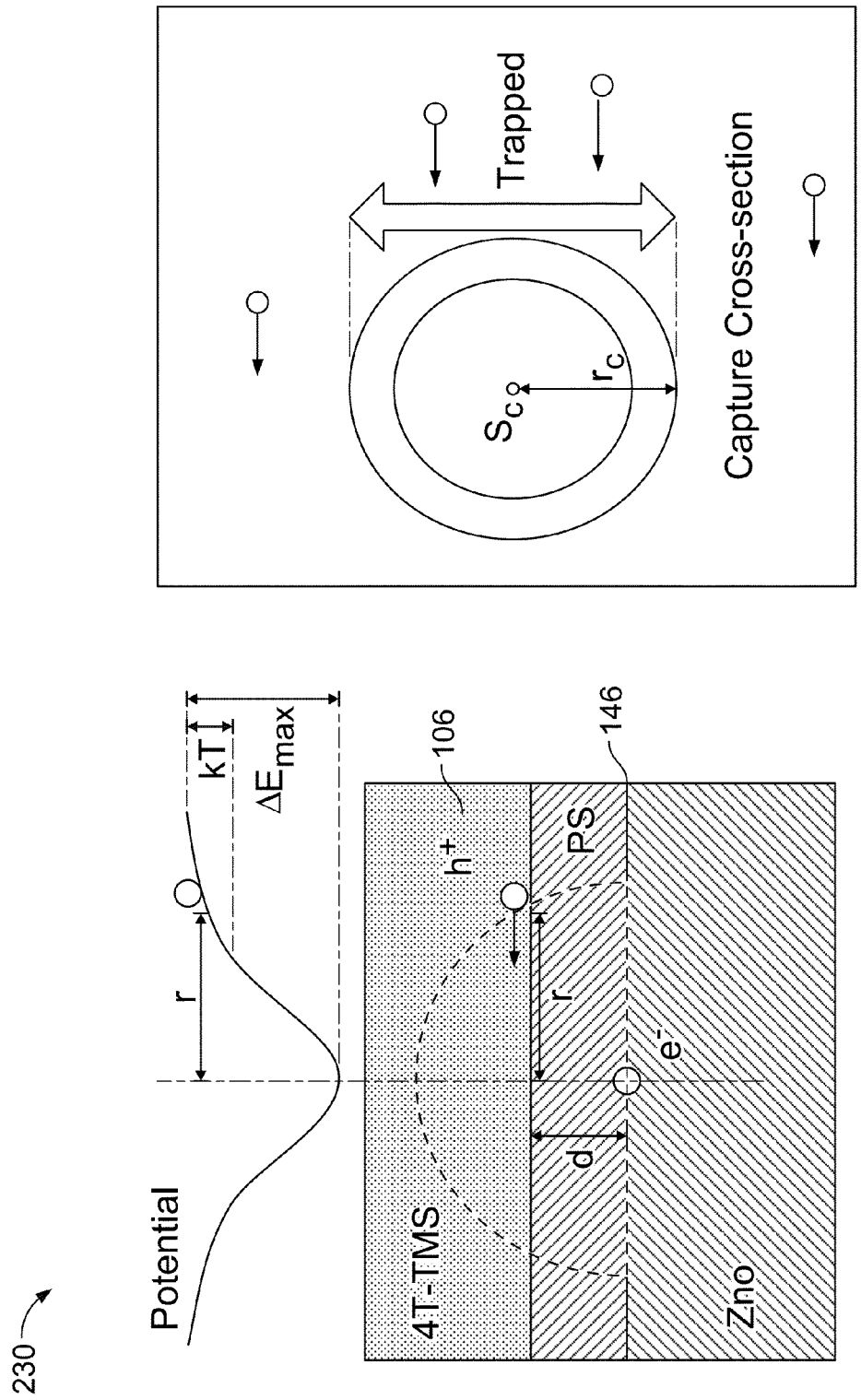
FIG. 3A is a diagram illustrating the depth and cross-section of the potential well caused by photo-induced confined electrons.

Referring to FIG. 3A, a diagram 230 shows the influence of the confined electrons at the polystyrene/ZnO interface 146 on the transporting holes in the channel layer 106. The exponential $I_{SD}$ decays can be explained by the trap-induced carrier mobility loss in the organic semiconductor channel of the field effect transistor. The $I_{SD}$ through the field effect transistor in the saturation regime can be described by $$I_{SD} = \frac{\mu C_i W}{2L}(V_g - V_t)^2 \quad \text{(Equ. 2)}$$

where $\mu$, $C_i$, W, L, $V_g$, and $V_t$ are the hole mobility, specific dielectric capacitance, channel width, channel length, gate bias, and threshold voltage, respectively. The mobility of the carriers (holes in 4T-TMS) is sensitive to the traps with an exponential dependence, $$\mu \propto \exp(-\Delta E_{tr}/kT) \quad \text{(Equ. 3)}$$

where $\Delta E_{tr}$ is the average energy trap depth caused by the columbic interaction between the confined electrons at the polystyrene/ZnO interface 146 and the transporting holes in the channel layer 106. The sensitive response of the carrier mobility in the semiconductor channel to energy traps is due to the columbic interaction of the channel carriers and the confined charges. The columbic interaction is important in changing the current in the channel of FET photodetector because of (i) the very thin separation layer (in the example of FIG. 1A, the polystyrene layer 114) between the channel layer 106 and the ZnO nano-particle layer 110, which is the thickness of polystyrene layer on the order of about 5 to 20 nm, and (ii) the low dielectric constant of polystyrene ($\varepsilon_r$=2.6).

Each confined electron at the polystyrene/ZnO interface 146 imposes a potential well for the transporting hole carriers in the semiconductor channel 106 due to the columbic force between them. The average trap depth by all of the generated traps is expected to be proportional to incident photons, or generated traps density $n_{tr}(t)$ at the ZnO/polystyrene interface 146, as well as the trap depth of each individual trap ($\Delta E_{max}$):

$$\Delta E_{tr}(t) = c \Delta E_{max} S_c n_{tr}(t) \quad \text{(Equ. 4)}$$

where $n_{tr}(t)$=aPt, which was determinate by UV light intensity (P, in a unit of photons/µm²s), the illuminating time (t), and the quantum efficiency (a) of the trap formation by the incident photons. The parameter $S_c$ is the cross-section of each trap as shown in FIG. 3A, and c is a constant describing how each individual trap contributes to the average trap depth. Therefore, one can derive $$I_{SD}(t) = I_0 \exp\left(-\frac{ac\Delta E_{max} S_c}{kT} Pt\right) \quad \text{(Equ. 5)}$$

where $I_0$ is the initial channel current. From Equation 5, we can determine the reason for the exponential decrease of the channel current under constant UV illumination and that the decay rate $k_{SD}$ is proportional to the UV light intensity ($k_{SD}=(ac\Delta E_{max}S_c/kT)P$). It is consistent with the experimental results shown in FIGS. 2B to 2E.

Based on the enhanced floating-gate mechanism, the thickness of the polystyrene layer 114 has an important role in determining the sensitivity of the FET photodetector 100. At a given trap density, a decreased polystyrene thickness generates an increased hole capture cross-section area and an increased average trap depth, as shown in FIG. 3A, both increasing $k_{SD}$.

Figure 3B:
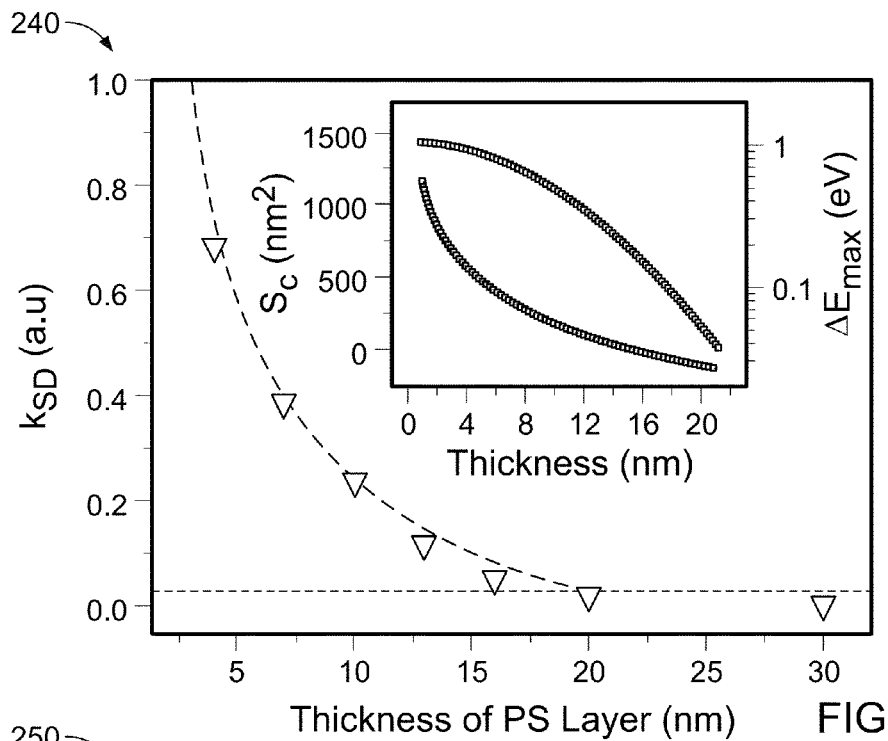
FIG. 3B is a graph showing calculated channel current decay rate from the enhanced floating-gate mechanism (dash line), and the measured decay rate of the FET photodetector as a function of the polystyrene layer thickness (triangle). The inset shows the cross-section and trap depth of the potential well as a function of the polystyrene layer thickness.

Referring to FIG. 3B, the $S_c$, $\Delta E_{max}$, and $k_{SD}$ of the devices with varied polystyrene thicknesses, from 30 nm to 5 nm, were calculated and are shown in a graph 240. As shown in FIG. 3B, the current decay rate of the FET photodetector 100 (which represents the sensitivity of the photodetector) increases significantly when the polystyrene thickness is less than 20 nm.

To verify the simulation result shown in FIG. 3B, a series of devices with varied polystyrene thicknesses were fabricated. For a better control of the polystyrene thickness, the polystyrene layer was spin coated from a pure polystyrene solution. The semiconducting layers (pentacene) were thermally deposited on the polystyrene surface.

Figure 3C:
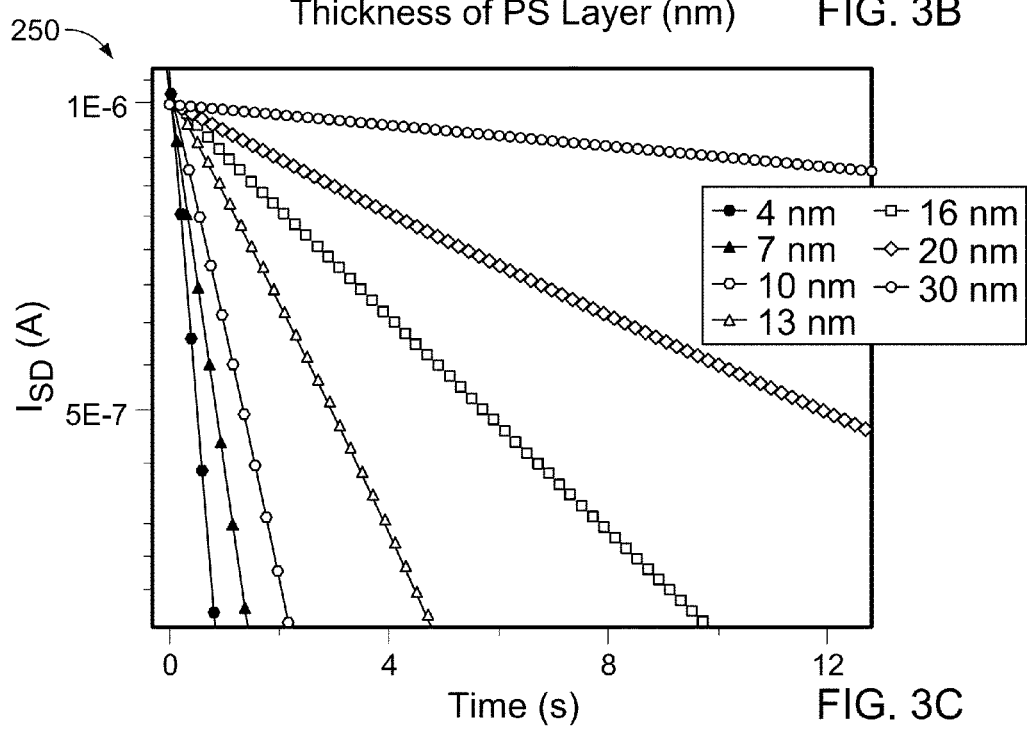
FIG. 3C is a graph showing variation of $I_{SD}$ of the FET photodetector with different polystyrene layer thickness.

Referring to FIG. 3C, the current decay of the devices with different polystyrene thicknesses under a UV light of 3 µW/cm² is shown in a graph 250, and the device output current decay rate is plotted in FIG. 3B. The results show that the device performance is very sensitive to the thickness of the polystyrene layer. The experimental results agree with the predicted $k_{SD}$ well with a single fitting parameter c of 0.013.

The FET photo sensor 100 shows a weak response under UV light when the polystyrene layer 114 exceeds 30 nm, probably because other mechanisms also contribute to the detection, such as a regular floating-gate mechanism. The current changes due to the regular floating-gate mechanism estimated from Equation 1 are also shown in FIG. 3C, and is ten times lower than the enhanced floating-gate mechanism when the polystyrene is thinner than 10 nm. This analysis shows how the thickness of the polystyrene layer 114 determines the device's sensitivity. The transistor channel current is determined by the channel width to length ratio (W/L) rather than channel area, and the output current decay rate $k_{SD}$ is independent of the device area. The signal ($\Delta I_{SD}$) of FET photon sensor 100 does not scale with device area, which is a useful feature for the application of photodetector arrays in which a high resolution can be achieved by scaling down the device size without compromising sensitivity.

The following describes the effect of trapped electrons, and an infrared photodetector is demonstrated. To further confirm the enhanced floating-gate mechanism and the universal application of such a device structure, an UV and infrared (UV-IR) photodetector based on same mechanism was fabricated. Lead sulfide (PbS) nano-particles were synthesized with a tunable size from 2 to 6 nm which extended the absorption of the active layer from UV to near infrared region. PbS nano-particles with sizes of 3-4 nm, which have an absorption cut-off of 1,150 nm and a band gap of about 1.1 eV, were mainly used in this example to demonstrate the working principle of infrared photodetectors, although PbS nano-particles of other sizes can also be used.

If ZnO nano-particles are replaced by lead sulfide (PbS) nano-particles in the device structure shown in FIG. 1A, the photodetector may not function well. It is possible that the lower LUMO of PbS nano-particles allows the injection of holes from 4T-TMS into PbS under the strong gate electric field and damaged the channel transport path. Another possible cause of the device failure may be the incompatible interface of PbS nano-particles layer with polystyrene dielectric.

Figure 4A:
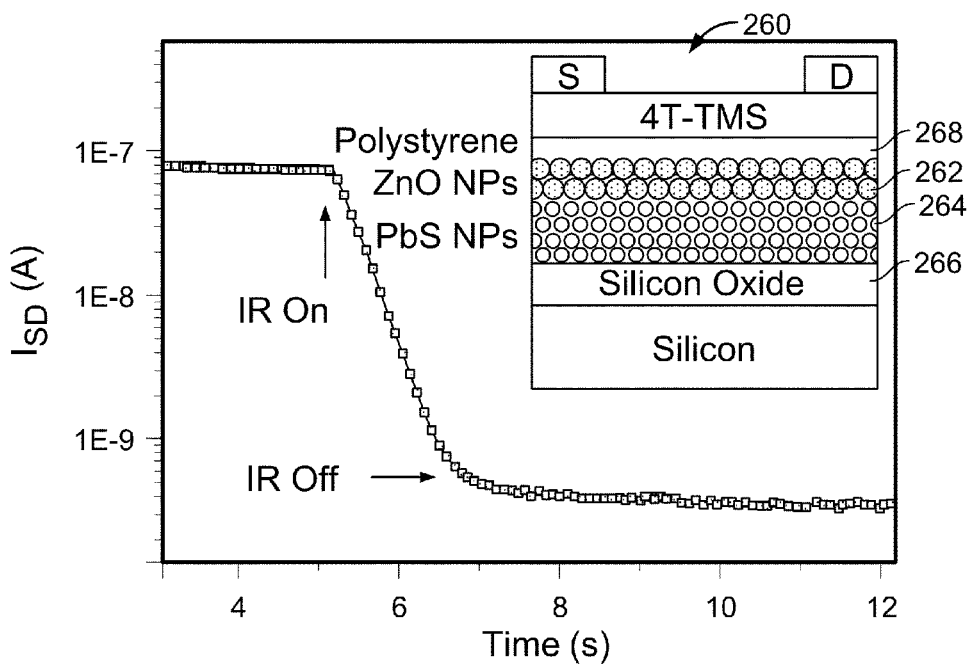
FIG. 4A shows a graph showing exponential channel current decay of the UV-IR FET photodetector illuminated by infrared light pulses having a wavelength of 900 nm. The inset shows a diagram of the structure of a FET photodetector, in which a PbS nano-particle layer is inserted between the $SiO_2$ and the ZnO nano-particle layer.

Referring to FIG. 4A, a FET photodetector 260 that can detect UV and infrared photons includes a layer of ZnO nano-particles and a layer of PbS nano-particles 264, both of which are positioned between a layer of SiO₂ 266 and a layer of polystyrene 268. The ZnO nano-particles/polystyrene interface in FET photodetector 260 is similar to that of the FET photodetector 100 in FIG. 1A, so the sensor 260 has a similar response to UV light as the sensor 100.

Figure 4B:
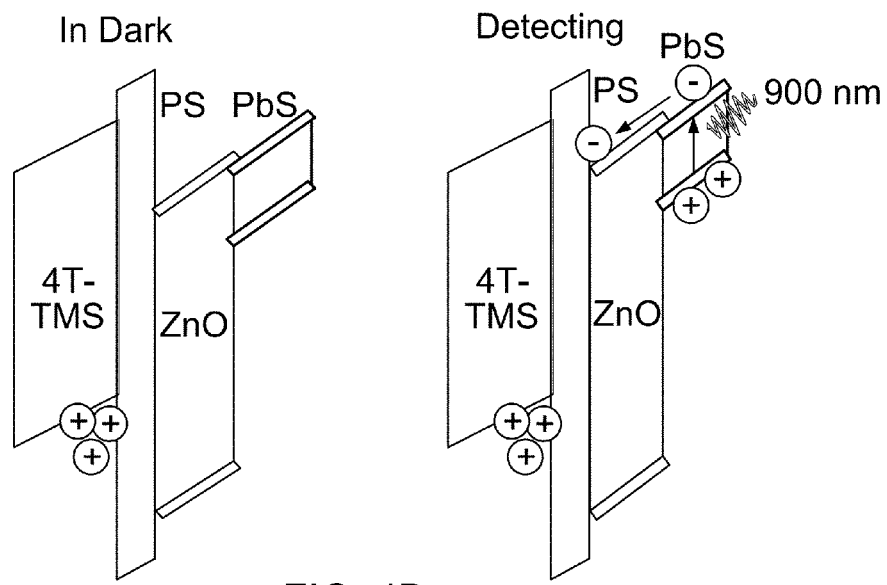
FIG. 4B is a diagram showing the detecting process of the UV-IR FET photodetector, in which the electrons are excited in the PbS nano-particle layer and then transported into the ZnO nano-particle layer.

Referring to FIG. 4B, under infrared illumination having a wavelength of 900 nm, the ZnO nano-particles are not excited directly due to its larger band gap, while electrons can be confined at the ZnO/polystyrene interface by the photo-induced electron transfer from PbS to ZnO nano-particles. Therefore, in addition to detecting UV light, the FET photodetector 260 can also detect infrared light.

As shown in FIG. 4A, channel current reduction can be observed when the FET photodetector 260 was illuminated by infrared light. This shows the enhanced floating-gate mechanism can be used in infrared sensitive photodetectors. It is likely that the trapping effect caused by the confined electrons in the ZnO nano-particle resulted in the observed current reduction.

To determine the stability of the FET photodetector 100, the device illuminated with UV light having an intensity of 100 nW/cm² for 200 hours. The test results indicate that the photodetector 100 does not show visible decay.

We have described a novel enhanced floating-gate transistor for photon detection and counting with high sensitivity at room temperature. The FET photodetector 100 has an enhanced floating-gate mechanism. The incident photons induce confined electrons beneath the channel layer which tune the current flowing through the transistor channel. In some examples, the photodetector can detect UV light intensity of 2.6 photons/µm²s (0.15 nW/cm²). The unique memory-like photodetecting process enables the FET photodetector to count the photons without dead time. A small spacing between the ZnO nano-particles and the channel region is important for the high device sensitivity observed. The FET photodetector can be used for un-cooled, low bias, low-cost, high-resolution photodetector arrays or photon-manipulated computation.

The following describes methods for fabricating the FET photodetector 100. In some implementations, highly arsenic-doped silicon having a resistivity of, e.g., 0.001 to 0.005 ohm/cm is used as the gate electrode, which is covered by a layer of thermal-grown silicon oxide (SiO₂) having a thickness of about, e.g., 200 nm. After UV-ozone treatment of the SiO₂ surface, a ZnO nano-particle layer having a thickness of about, e.g., 60 nm is spin coated from a ZnO:chlorobenzene (e.g., 2.5 wt %) solution at, e.g., 3000 rpm for, e.g., 40 seconds. The ZnO nano-particle layer is thermally annealed in the air at, e.g., 260° C. for about, e.g., 30 minutes.

In some implementations, for the fabrication of the semiconductor channel layer, trimethyl-[2,5'5',2",5",2'"]quarterthiophen-5-yl-silane (4T-TMS) and polystyrene (e.g., 9:1 by weight) are dissolved in 1, 2-dichlorobenzene (DCB) (e.g., 4 mg/ml in all). Then the solution is drop coated on the ZnO surface, during which the substrate is located on a tilted hotplate. The tilting angle can be, e.g., 2.5°, and the drying temperature can be 80° C. During the drying process, there is a vertical phase separation between the polystyrene and 4T-TMS components, which results in a bilayer structure of polystyrene/4T-TMS with the polystyrene thin film attached on the ZnO surface. Gold (Au) source and drain electrodes are thermal evaporated with a channel length and width of 100 μm and 1 mm, respectively. The electrical characteristics of the devices can be measured using, e.g., two Keithley 2400 Source Meters in ambient conditions.

To test the FET photodetector, UV light can be generated from deep UV light emitting diodes (LED) having a wavelength of 345 nm (e.g., UVTOP®345TO39/TO18FW, Sensor Electronic Technology, Inc.). The photodetector and the UV LED can be placed in a metal box to exclude the ambient light. The UV intensity can be controlled by changing the driving current of the diodes and using neutral filters. The incident light intensity can be calibrated with a UV photodetector before applying the filters.

The following describes modeling of device sensitivity versus polystyrene thickness. The influence of the polystyrene thickness (d) on the decay rate of the device current under illumination can be estimated as follows.

The cross-section of the photon-induced high resistance region (shown in FIG. 3A) is:

$$S_c = \pi r_c^2 \qquad \text{(Equ. 6)}$$

Here, a critical boundary is defined for the trapping cross-section having a radius of $r_c$ in which the thermal activation energy of electrons is no more than the potential depth, i.e., $q/4\pi\epsilon_r\epsilon_0\sqrt{d^2+r^2} \geq kT$, where $\epsilon_r$ is the relative dielectric constant of polystyrene (2.6), $\epsilon_0$ is the dielectric constant of vacuum, r is the horizontal distance between the hole and the confined electron, k is the Boltzmann constant, and T is the room temperature. A reduced d resulted in an increased $r_c$ and, hence, an increased $S_c$.

A reduced polystyrene thickness results in deeper traps which cause larger velocity loss of transporting holes. The maximum value of the depth is:

$$\Delta E_{max} = q/4\pi\epsilon_r\epsilon_0 d \qquad \text{(Equ. 7)}$$

The decay rates $k_{SD}$ of the FET photodetector 100 can be determined from Equations 5 to 7 as shown in FIG. 3B, in which the trap formation efficiency a (38%) is assumed to be equal to the absorbance at 345 nm (FIG. 1D).

A light sensor can include the FET photodetector 100 or 260, and a control circuit to control the operation of the FET photodetector. The control circuit may provide bias voltages to the drain, source, and gate electrodes. The control circuit may provide the reset gate pulses 186 shown in FIG. 2B. The control circuit may include a readout circuit to determine the amount of change in the channel current, and determine the number of photons detected based on the current change. The FET photodetector 100 and 260 can be calibrated to establish a relationship between the number of photons detected and the amount of current change. The calibrated values can be stored in a lookup table.

An image or video sensor can include an array of pixels in which each pixel includes a FET photodetectors 110 (or 260). Such image or video sensor can be used to generate images or video at very low light environments. For example, to use the FET photodetector in a camera image sensor, a controller generates a bias voltage that is applied to the gate electrode. The camera shutter is opened for a certain amount of time, and the change in the channel current is measured. Based on a predetermined relationship between the amount of light detected and the change in the channel current, the light intensity at each FET photodetector can be determined based on the amount of channel current change. After an image is read from the array of pixels, the controller generates a reverses bias voltage that is applied to the gate electrode to reset the photodetectors.

In some implementations, an image sensor can have several FET photodetectors in which some of the photodetectors can detect UV light, and some of the photodetectors can detect infrared light and/or visible light. This way, the image sensor can detect a wide range of light wavelengths. An image sensor can also have several FET photodetectors in which each photodetector includes two or more photoactive materials that in combination enables the photodetector to detect a wide range of light wavelengths.

As described above, the structure of enhanced floating-gate photodetector is based on a field-effect transistor, which includes a source electrode, a drain electrode, a gate electrode, composite dielectric layer(s), and composite conducting layer(s). In addition, optical coupling structures and interfacial buffer layers can be combined.

The FET photodetector 100 can be modified in various ways. For example, the field effect transistor can be a lateral field effect transistor. A lateral FET can be a bottom-gate/top-contact FET, a bottom-gate/bottom-contact FET, a top-gate/top-contact FET, or a top-gate/bottom-contact FET. A vertical field effect transistor can also be used.

The source and drain electrodes can be electron-injecting type electrodes, and the electrodes can be made of, for example, magnesium, aluminum, calcium, lithium, sodium, potassium, strontium, cesium, barium, iron, cobalt, nickel, copper, silver, zinc, tin, samarium, ytterbium, chromium, gold, grapheme, alkali metal fluoride alkaline-earth metal fluoride, alkali metal chloride, alkaline-earth metal chloride, alkali metal oxide, alkaline-earth metal oxide, metal carbonate, metal acetate, n-type silicon (n-Si), or a combination of the above. The source and drain electrodes can also be hole-injecting type electrodes, and the electrodes can be made of, for example, indium-tin oxide (ITO), indium zinc oxide (IZO), silver, gold, platinum, copper, chromium, indium oxide, zinc oxide, tin oxide, polyaniline (PANT) based conducting polymer, 3,4-polyethylenedioxythiopene-polystyrenesultonate (PEDOT) based conducting polymer, carbon nanotube (CNT), graphite, grapheme, molybdenum oxide, tungsten oxide, vanadium oxide, silver oxide, aluminum oxide, p-type silicon (p-Si), or a combination of the above.

The material for the gate electrode can be metal, for example, magnesium, aluminum, calcium, lithium, sodium, potassium, strontium, cesium, barium, iron, cobalt, nickel, copper, silver, zinc, tin, samarium, ytterbium, chromium, gold, alkali metal, silver, gold, platinum, copper, chromium, or a combination of the above. The gate electrode can also be made of an inorganic semiconductor, for example, electrically doped Si, germanium, III-V semiconductors, II-VI semiconductors, ITO, IZO, indium oxide, zinc oxide, tin oxide, molybdenum oxide, tungsten oxide, vanadium oxide, silver oxide, aluminum oxide or combinations thereof. The gate electrode can be made of organic materials, for example, polyaniline (PANT) based conducting polymer, 3,4-polyethylenedioxythiopene-polystyrenesultonate (PEDOT) based conducting polymer, carbon nanotube (CNT), graphite, graphene, or a combination of the above.

The insulating dielectric layer can be an inorganic dielectric material, for example, silicon oxide ($SiO_x$), silicon nitrides ($SiN_x$), aluminum oxide ($AlO_x$), tantalum oxide, titanium oxide, hafnium oxide, zirconium oxide, cerium oxide, barium titanate ($BaTiO_3$), barium zirconate titanate (BZT), barium strontium titanate (BST), lead zirconate titanate (PZT). The dielectric layer can be an organic dielectric material with groups including polystyrene (PS), polymethylmethacrylate (PMMA), poly(4-methoxyphenylacrylate) (PMPA), poly(phenylacrylate) (PPA), poly(2,2,2- trifluoroethyl methacrylate) (PTFMA), polyvinyl alcohol (PVA), cyanoethylpullulan (CYEPL), polyvinyl chloride (PVC), poly-4-vinylphenol (PVP), cross-linked PVP, PVP copolymer, benzocyclobutene (BCB), poly(ethylene terephthalate) (PET), polyvinylacetate (PVAc), polyvinylidene fluoride (PVDF), polychlorotrifluoroethylene, polytetrafluoroethylene (PTFE), polyimide, polyester, polynorbornene, perylene, or a combination of the above. The dielectric layer can be made of polymeric-nanoparticle (NPs) composites, for example, the polymer mentioned above combining with $TiO_2$ NPs, $BaTiO_3$ NPs, $Al_2O_3$ nanoparticles.

The photoactive layer can be a single pristine film, a mixed film, or a stacked film. The photoactive materials can be embedded in other insulating and/or semiconducting matrixes. The thickness of each layer can be from, e.g., 1 nm to 10 µm.

The photoactive materials can be in the form of photo active nano-particles, nano-rods, or nano-wires. The materials include zinc oxide (ZnO), titanium oxide ($TiO_x$), tin oxide ($SnO_x$), indium oxide ($InO_x$), copper oxide ($Cu_2O$), zinc sulfide (ZnS), cadmium sulfide (CdS), lead sulfides (PbS), iron pyrite ($FeS_2$), cadmium selenide (CdSe), lead selenide (PbSe), cadmium telluride (CdTe), lead telluride (PbTe), silicon (Si), germanium (Ge), gallium nitride (GaN), gallium arsenide (GaAs), indium arsenide (InAs), indium antimonide (InSb), $Pb_{1-x}Sn_xTe$, $Hg_{1-x}Cd_xTe$, InAsSb, InTlSb. The photoactive material can include super lattices, e.g., InAs/GaInSb, HgTe/CdTe. The photoactive material can be an organic material with conjugated π-electronic systems, e.g., including $TiO_x$: phthalocyanine derivatives, naphthalocyanine derivatives, porphyrin derivatives, perylene derivatives, coumarin derivatives, rhodamine derivatives, eosin derivatives, erythrosine derivatives, acenes and polyacenes derivatives, oligothiophenes derivatives, benzothiophene (BT) derivatives, benzothiadiazole derivatives, benzodithiophene (BDT), fullerene derivative (e.g. C60, carbon nanotube, graphene and etc.), perylene derivative, polythiophene (PT) derivatives, polycarbazole or its derivatives, poly(p-phenylene vinylene) (PPV) or its derivatives, polyfluorene (PF) or its derivatives, cyclopentadithiophene based polymers, benzodithiophene (BDT) based polymers, or a combination of two or more of the above materials.

The ranges of wavelengths of light (λ) that can be absorbed by the materials are listed below:

ZnO: λ<370;
TiOx: λ<390 nm;
SnOx: λ<320 nm;
InOx: λ<420 nm;
$Cu_2O$: λ<600 nm;
ZnS, λ<360 nm;
CdS, λ<520 nm;
PbS, λ<3300 nm;
FeS2, λ<1.6 µm;
CdSe, λ<720 nm;
PbSe, λ<4.6 µm;
CdTe, λ<830 nm;
PbTe, λ<5.0 µm;
Si, λ<1.1 µm;
Ge, λ<1.9 µm;
InAs, λ<3.5 µm;
GaAs, λ<870 nm;
GaN, λ<370 nm;
InSb, λ<7.3 µm;
$Pb_{1-x}Sn_xTe$, λ<6.0 µm;
$Hg_{1-x}Cd_xTe$, λ<12 µm;
InAsSb, λ<10 µm;
InTlSb, λ<8.5 µm;
organic semiconductors: 250 nm<λ<750 nm.

Thus, when different materials are used in the FET photodetector, the photodetector can be used to detect different wavelengths of light.

The composite conducting layer(s) can be single pristine film, mixed film, or stacked film.

The conducting materials can be small molecular or polymer conjugating semiconductors, including phthalocyanine derivatives, naphthalocyanine derivatives, porphyrin derivatives, perylene derivatives, coumarin derivatives, rhodamine derivatives, eosin derivatives, erythrosine derivatives, acenes and polyacenes derivatives, oligothiophenes derivatives, benzothiophene (BT) derivatives, benzothiadiazole derivatives, benzodithiophene (BDT), fullerene derivative (e.g. C60, carbon nanotube, graphene and etc.), perylene derivative, polythiophene (PT) derivatives, polycarbazole or its derivatives, poly(p-phenylene vinylene) (PPV) or its derivatives, polyfluorene (PF) or its derivatives, cyclopentadithiophene based polymers, benzodithiophene (BDT) based polymers, or a combination of two or more of the above materials.

In the example of FIG. 1A, the channel layer is made of P-type semiconductor, and a negative bias voltage is applied to the gate electrode during the photodetecting mode. In some implementations, the channel layer is made of N-type semiconductor, and a positive bias voltage is applied to the gate electrode during the photodetecting mode.

The technique of using confined charges to influence channel current in a field effect transistor can be applied to a trap-triggered field effect transistor photodetector. In the example described below, an organic field effect transistor is used, but other types of field effect transistors can also be used.

Figure 5A:
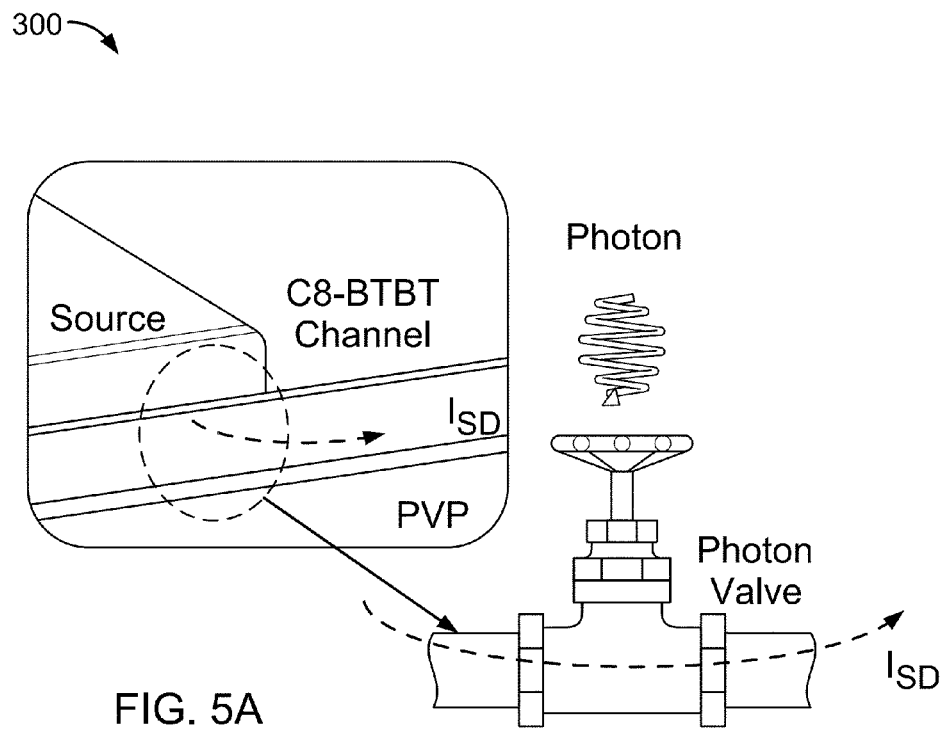
FIG. 5A is a diagram showing how incident photons from a scintillator trigger the charge injection in the field effect transistor and tune the output current.

Referring to FIG. 5A, a trap-triggered organic field-effect transistor (TTOFET) photodetector 300 uses the interactions of photon, carrier, and traps in a light-trapping structure to produce a novel mechanism for high gain and low noise. The device uses the incident photon as a switching valve to control the source-drain output current ($I_{sd}$). The trap-triggered organic field-effect transistor photodetector 300 allows dramatic changing of the hole injection from the electrode into the semiconductor channel by the trapped-electron-induced hole injection at the organic semiconductor/electrode interface. Because the trapped electrons are induced by the incident photons, each absorbed photon will cause a large output current change in the photodetector 300, resulting in a large apparent gain. The working principle of the photodetector 300 is shown in FIG. 5A. In some examples, the photodetector 300 can have a high gain in excess of $10^7$ and a small noise current less than 1 nA at room temperature.

Figure 5B:
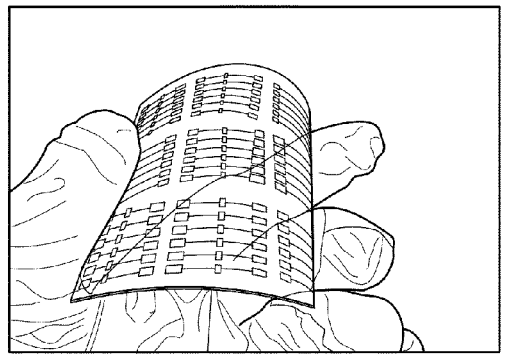
FIG. 5B is a photo of a flexible, transparent organic field effect transistor array.

FIG. 5B is a photo of a flexible, transparent organic field effect transistor array.

The trap-triggered organic field-effect transistor photodetector 300 can detect weak light using the trapped-electron-induced charge injection mechanism, which can be used to detect very weak light from a scintillator. This has applications in radiation detectors. For example, radiation detectors can be used to detect nuclear and radiological materials. A radiation detector may include a scintillator. In the scintillation detection process, high energy photons (such as gamma-rays) strike a scintillator material to emit ultraviolet (UV)-visible photons which are subsequently measured and amplified by photodetectors. The trap-triggered organic field-effect transistor photodetector 300 can be used to detect the photons emitted from the scintillator material. By using solid-state photodetectors that can operate in room temperature, small, efficient, robust, and low cost single radiation detectors and detector arrays can be fabricated. This has wide ranging applications in the field of homeland security. The solid state photodetectors can be powered by a low voltage, and can operate unattended for long periods of time using battery or solar power.

The trap-triggered organic field-effect transistor photodetector 300 can have a performance comparable or superior to that of a photo multiplier tube. The solid-state photodetector can be driven by a relatively low bias voltage, and has excellent responsivity to the photon emission from a scintillator. The photodetector can be integrated with a low-cost nanocomposite scintillator, enabling the detection and interdiction of nuclear/radiological devices or component materials, allowing the deployment of many compact, unobtrusive detectors in remote areas—such as smuggling routes—where persistent manned surveillance may be difficult.

In determining the performance of a photodetector, an important figure of merit is specific detectivity, which characterizes the weakest light it can detect, or the sensitivity of the photodetector. The specific detectivities (D*) of a photodetector are given by:

$$D^* = \frac{(AB)^{1/2}}{NEP} \left( cm\, Hz^{\frac{1}{2}} W^{-1} \text{ or Jones} \right) \quad \text{(Equ. 8)}$$

$$NEP = \frac{\overline{i_n^2}^{1/2}}{R}(W),\, R = EQE/h\nu, \quad \text{(Equ. 9)}$$

where A is the device area, B is the bandwidth, NEP is the noise equivalent power, $\overline{i_n^2}^{1/2}$ is the measured noise current, R is the responsivity, EQE is external quantum efficiency, and hν is the energy of the incident photon. A sensitive photodetector will have high EQE and low noise for maximum signal-to-noise ratio.

The trap-triggered organic field effect transistor photodetector has a high sensitivity and can operate in room temperature due to the high hole mobility and low electron mobility of the organic semiconductor, the good insulating property of the polymer dielectric material, the large band gap of the semiconductor channel material dioctylbenzothienobenzothiophene (C8-BTBT) (Eg=3.43 eV), and the high energy barrier for the trapping of electrons in organic semiconductors.

Figure 6B:
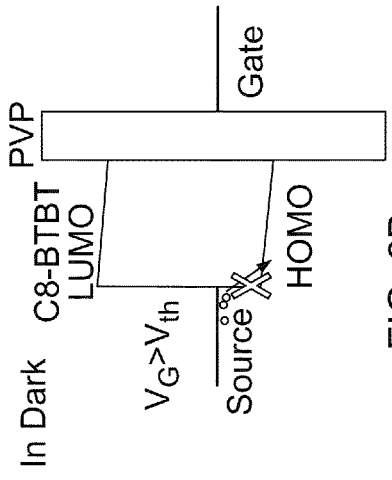
FIG. 6B is an energy diagram of the device at source/semiconductor interface in the dark with a bias voltage $V_G > V_T$.
Figure 6D:
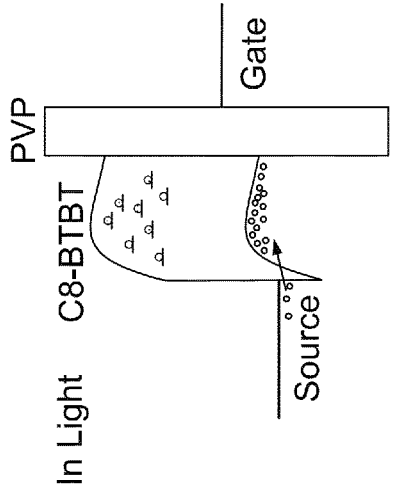
FIG. 6D is an energy diagram of the device at source/semiconductor interface under light with a bias voltage $V_G > V_T$.
Figure 6A:
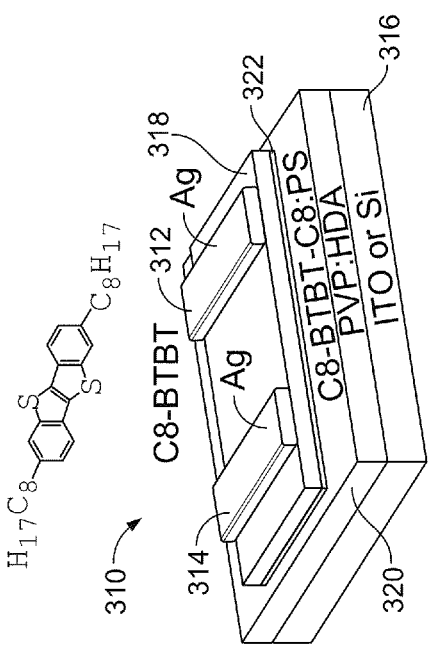
FIG. 6A is a diagram of the device structure of the C8-BTBT TTOFET.

Referring to FIG. 6A, in some implementations, a TTOFET 310 is based on a bottom-gate, top-contact organic field effect transistor (OFET). The TTOFET 310 includes a source electrode 312, a drain electrode 314, a gate electrode 316, a channel layer 318, and a dielectric layer 320. A window (not shown in the figure) in the photodetector allows light to shine on the channel layer 318. A controller (not shown in the figure) provides relevant bias voltages to the photodetector and reads out changes in the channel current to determine the amount of light detected.

The device can be fabricated using an all-solution process. The gate electrode 316 can be made of, e.g. ITO, and is covered by a low temperature cross-linked poly(4-vinylphenol) (PVP) dielectric layer 320. The organic semiconductor films are deposited in an nitrogen inert atmosphere on the PVP layer 320 from a C8-BTBT:polystyrene solution to form the C8-BTBT channel layer 318. Due to vertical separation of the solution, a thin polystyrene layer 322 is formed below the C8-BTBT layer. The C8-BTBT material is a p-type, air stable, small molecule, organic semiconductor having a mobility of about 5 cm²/Vs. Silver (Ag) source and drain electrodes 312 and 314 are thermally deposited with a channel length of 50 μm and a channel width of 1 mm, respectively.

Figure 6C:
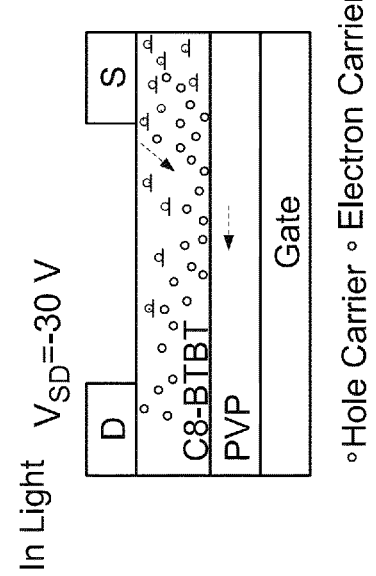
FIG. 6C is a diagram showing formation of trapped electrons and triggered channel current in the TTOFET by UV light.

FIGS. 6B to 6D show the photon detection process of the TTOFET photodetector 310. The device operates in the depletion mode in which a gate bias larger than the threshold voltage ($V_G > V_{th}$) is applied to deplete holes in the C8-BTBT channel layer. The injection of holes from the source electrode 312 is prohibited by the large energy barrier, as shown in FIG. 6B, which results in a low dark-current (noise). A feature of the TTOFET photodetector 310 is that the dark-current is reduced due to the application of the gate bias voltage.

When the channel region is illuminated by UV light, excitons are generated in the C8-BTBT semiconductor layer. Some excitons will dissociate into free holes and electrons by the applied gate, source-drain electrical field or trap assisted exciton dissociation. Derived by the applied source-drain electrical field, the holes drift toward the drain electrode immediately, while electrons are trapped in the p-type C8-BTBT. The trapped electrons near the source electrode can increase the channel current by inducing strong hole injection, as illustrated in FIG. 6D.

The trapped electrons on the source electrode side shift the highest occupied molecular orbital (HOMO) of the C8-BTBT and align its HOMO with the Fermi energy of the source electrode. The hole-injection barrier on the source side then becomes so thin that the holes can easily tunnel through it. Thus, the electron-trapping layer acts as a photoelectronic valve for hole injection. Incident photons can switch this valve "on". If, on average, more than one hole is injected from Ag to the C8-BTBT layer per absorbed photon, there is internal gain from the device.

Once the energy barrier for hole injection at the cathode becomes negligible, the source contact changes from the Schottky contact into the ohmic contact, which provides a large current injection. In addition to the trapped-electron-induced hole injection at the source electrode, the trapped electrons in the C8-BTBT near the dielectric interface also screen the gate voltage and cause a shift of threshold voltage, which further increases variation of source-drain output current ($\Delta I_{SD}$) upon light illumination.

Phototransistors can operate in photovoltaic mode or photoconductor mode. For the photovoltaic mode, the gain is proportional to the photo induced channel current with:

$$\Delta I = g_m \Delta V_T \quad \text{(Equ. 10)}$$

where $\Delta V_T$ is the photo-induced threshold voltage shift and $g_m$ is the transconductance. For the photoconductor mode, the gain is the ratio of the trapped electron lifetime ($\tau_r$) and hole transit time ($\tau_t$)) through the channel layer:

$$G = \tau_r/\tau_t,\, \tau_t = d^2/\mu_h V_{SD} \quad \text{(Equ. 11)}$$

where d is the channel length, and $\mu_h$ is the hole mobility in C8-BTBT. The TTOFET photodetector 310 combines both operation modes by the dual functions of the trapped electrons. The trapped electrons in the channel layer cause the photovoltaic effect, and the piling of trapped electrons at the metal/organic semiconductor interface turn on the photoconductor effect. The unique advantage of the TTOFET photodetector 310 is that both photoconductive gain and photovoltaic gain are triggered on by the incident photons.

Figure 7A:
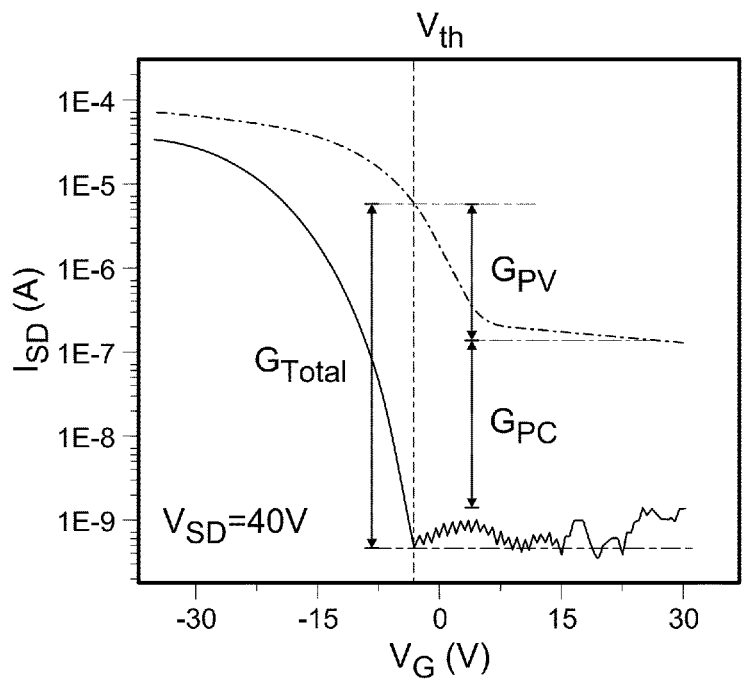
FIG. 7A is a graph showing the channel current of the C8-BTBT TTOFET in the dark and under UV light.
Figure 7B:
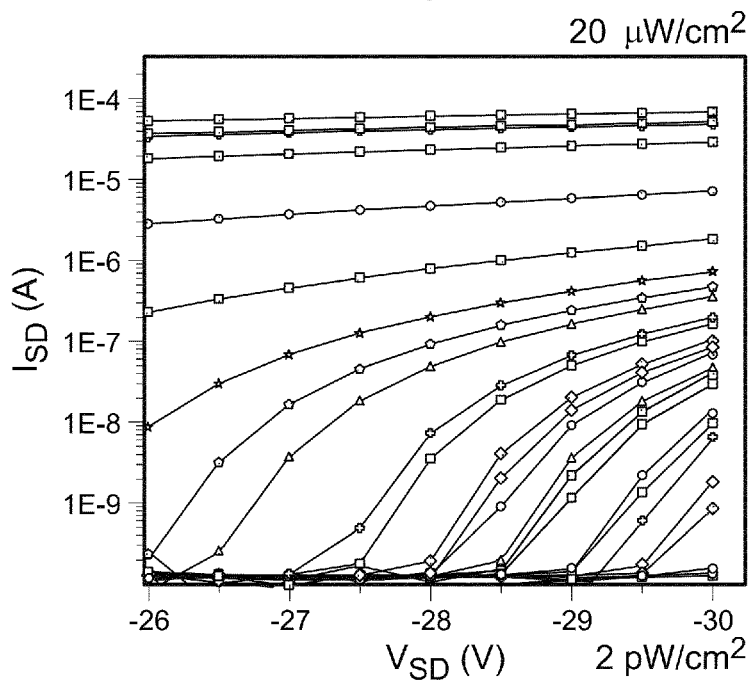
FIG. 7B is a graph showing the channel current of the C8-BTBT TTOFET under a UV light ranging from 2 $pW/cm^2$ to 20 $\mu W/cm^2$.
Figure 7C:
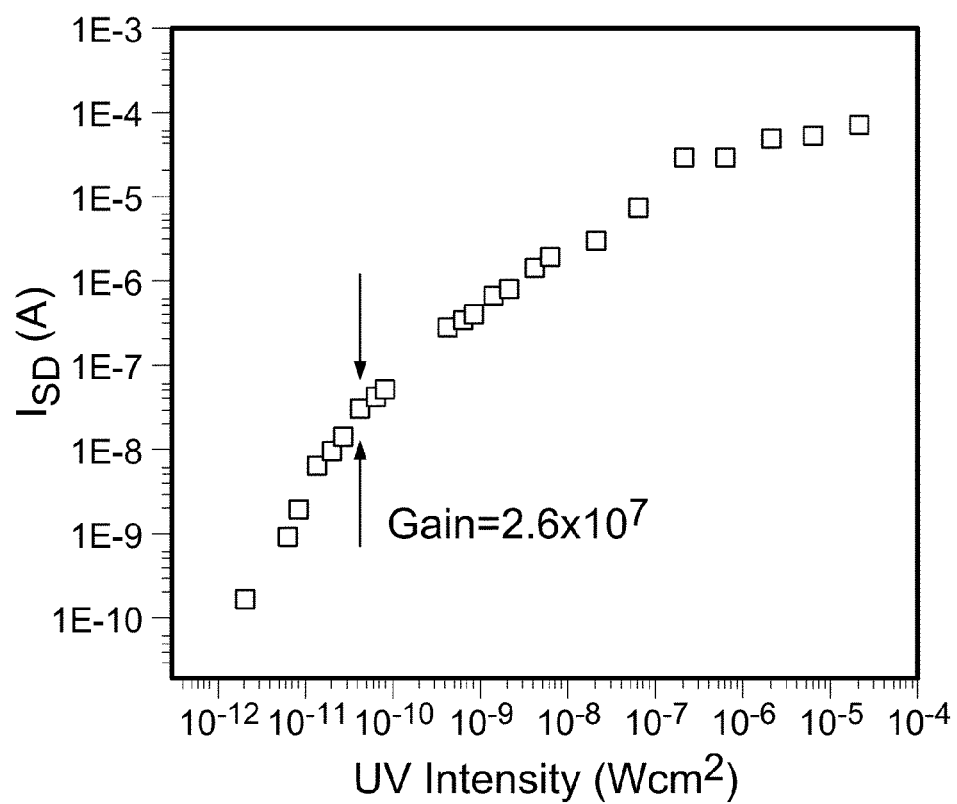
FIG. 7C is a graph showing the channel current at a $V_{sd}$ of −30 V as a function of the incident light intensity.

FIG. 7A shows the transfer curve of the TTOFET in dark and under illumination of 0.1 μW/cm². The device shows large variation in output current in the dark and under UV illumination. The off-current (dark current) is less than 1 nA, which is limited by the measurement equipment. Under light, both threshold voltage shift and increase of the current in the positive gated region ($V_G > V_{th}$) were observed, verifying the dual-mode operation. The gain of the dual modes can be summed, yielding a high gain of $10^7$ in these phototransistors, as shown in FIGS. 7B and 7C. The combination of the high gain and low noise can be used to produce a very sensitive solid-state photodetector that can operate at room temperature.

Referring to FIG. 8A, in some implementations, a TTOFET photodetector 310 includes a p-n heterojunction formed by depositing a layer of acceptor materials 332, such as $C_{60}$ or ZnO nanoparticles, on top of the C8-BTBT layer 318. Both $C_{60}$ and ZnO are good electron acceptors with deeper (lowest unoccupied molecular orbital) LUMO than C8-BTBT, as shown in FIG. 8B. One additional advantage of adding the acceptor materials is that both $C_{60}$ and ZnO are good UV light absorbers, and the photogenerated excitons can dissociate at the heterojunction interface, contributing more free charges and increasing the absorption of light by the photodetector. The thickness of the acceptor layers may be limited to the exciton diffusion length in these materials.

Possible sources of the electron traps in the photodetector include the grain boundary in C8-BTBT polycrystalline films, C8-BTBT damage caused by the thermal evaporation of Ag source/drain electrodes, and the —OH groups on the surface of the dielectric material PVP.

Under weak light, the current flowing through the photodetector is determined by the electron injection from the Ag electrode to the C8-BTBT layer. Under the dark condition, the high energy barrier blocks any hole injection and is lowered by the trapped electrons upon light absorption. The trapped electrons lower the hole injection barrier by doping the interface sheet, which has the same mechanism of the ohmic contact by the high doping concentration in inorganic semiconductor technology. The energy barrier change $\Delta\Phi$ is a linear function of trapped electrons ($n_t$), while the injection current follows an exponential relationship with the energy barrier change according to the Richardson-Dushman equation:

$$J \propto \exp\left(-\frac{\Delta\Phi}{kT}\right) \propto \exp\left(-\frac{n_t}{kT}\right) \quad \text{(Equ. 12)}$$

Therefore, there is gain due to the exponential dependence of injected holes and incident photons. This model can be improved by considering the influence of trap distribution and lifetime, light intensity, and applied bias on the current injection. The distribution of electron traps along the out-of-plane direction may change the potential barrier profile.

The grain size of C8-BTBT can be increased by optimizing the spin-coating parameters. For example, an off-center spin-coating (OCSC) method can be used to increase the mobility of C8-BTBT to a high mobility above 118 cm$^2$/Vs. The highly crystalline C8-BTBT OFETs can be used for the TTOFET photodetector. In addition to the reduced electron trapping lifetime, the high hole mobility may reduce the hole transit time, which may compensate partially for the lost gain due to the short hole recombination lifetime (Equation 11). An alternative approach to increase the response speed without comprising gain is to reduce the channel length from the current 50 μm to about 1 to 10 μm, which can increase the response speed by about 25 to 2,500 times (Equation 11). Thus, the TTOFET photodetector can have millisecond response time.

The mobility of 118 cm$^2$/Vs is very high for organic semiconductors. As an alternative to the organic semiconductors, graphene can be used as another semiconductor channel material to form a hetero-planar structure with C8-BTBT. Due to the deeper HOMO of C8-BTBT (5.7 eV) vs. graphene (4.5 eV), holes will transfer to graphene and transport through it. This energy offset will also aid the dissociation of excitons in C8-BTBT. Compared to an organic semiconductor, graphene has several orders of magnitude higher carrier mobility (up to 200,000 cm$^2$/Vs$^{67}$) and thus may have a faster response (>GHz). The graphene layer can be transferred onto the dielectric surface before the deposition of the organic semiconductor. The injection of holes into graphene in dark conditions is prohibited by the inserted C8-BTBT layer. Commercially available graphene layers on metal or dielectric substrates can be used. In some implementations, to deposit the graphene layer on polystyrene, the graphene layers can be transferred to PDMS stamps. After removing the tape chemicals, the graphene can be heat-transferred to the polystyrene surface.

Figure 9:
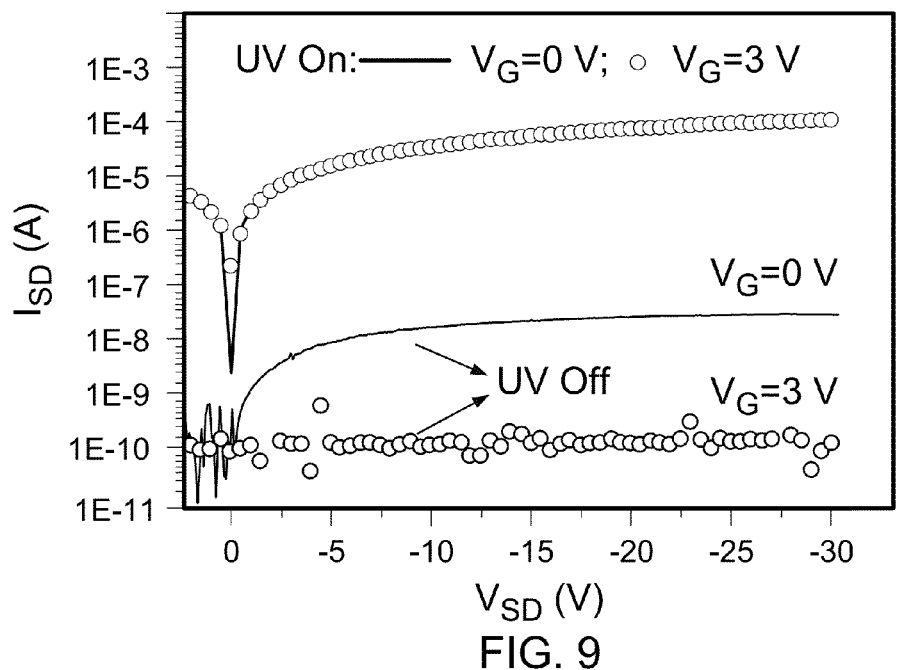
FIG. 9 is a graph showing reduced dark current of the TTOFET by a positive gate bias to deplete the channel region.
Figure 10:
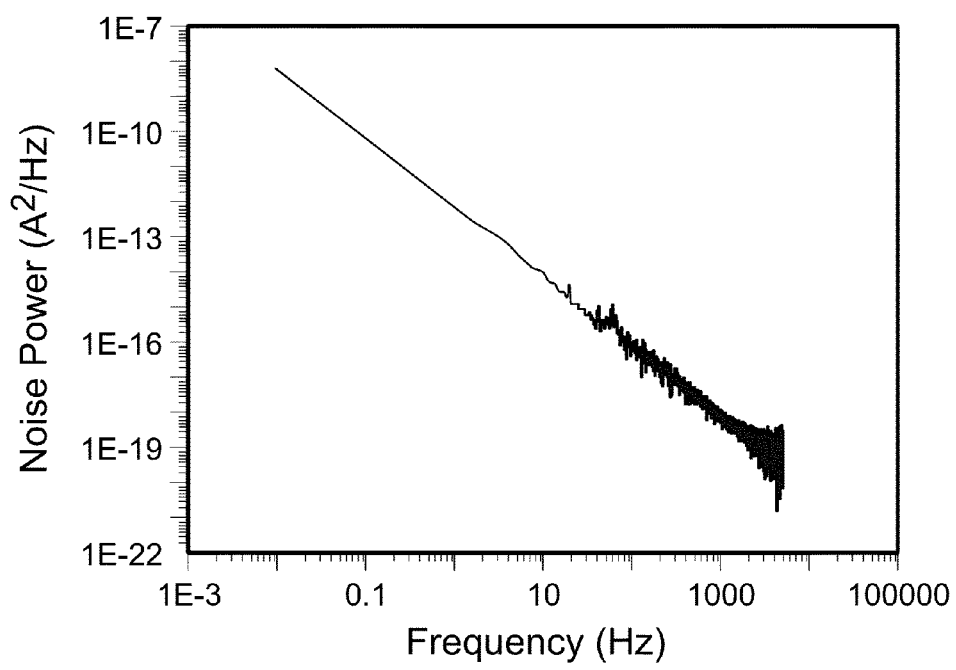
FIG. 10 is a graph showing the low frequency noise spectral curves for an OFET device with a $I_{SD}$ of about 1 $\mu A$.

The lowest detectable light intensity for the photodetector is determined by the signal/noise ratio. The noise in this type of detector comes from the fluctuation of the channel current. To detect weak light intensity, the induced $I_{SD}$ by the absorbed photon must be larger than the noise so that a single photon is detectable. The noise in field effect transistors is dependent on frequency and bias. There may be three sources of electrical noise in a solid material: (1) thermal noise (or Johnson noise), (2) shot noise (or quantum noise), and (3) low-frequency noise (or flicker noise, 1/f noise, where f is the frequency). Due to the high band gap of organic semiconductor materials used (3.4 eV), the thermal noise is negligible. This makes the TTOFET operable at room temperature. The quantum noise can be largely restrained by reducing the dark current. The dark current of the TTOFET device cannot be ignored even with a gate voltage of 0 V due to the unintended chemical doping or small charge injection, as shown in FIG. 9. The dark current can be suppressed by depleting the channel region with a $V_G > V_T$. The noise of an OFET photodetector, as shown in FIG. 10, reveals that its low-frequency noise follows a power spectrum of characteristics: $1(f)^2 \propto f^{-\alpha}$ with $\alpha = 1.8$. It is a typical characteristic of noise originating from the trapping/de-trapping of holes, most likely at the grain boundary of the polycrystalline organic semiconductor in the channel of the OFET.

Noise reduction can be achieved by using crystalline semiconductors and graphene. By growing high-crystalline, large-grain-size organic semiconductor single crystals and/or large area graphene flakes, the grain trap density can be reduced. The thermal noise $I_{SD}$ of an OFET device can be important if the device is operated at very high frequency. Despite small thermal noise, the 1/f decays quickly with the increased frequency, which limits the up-limit working frequency of the detector by assuming a $1/f^{1.8}$ dependence. The thermal noise is determined by: $I_{nd}^2 = 8kT g_m/3$, where $g_m = \mu(V_G - V_T)WC_i/L$ is the transconductance of the transistor at a certain gate bias. If the TTOFET device works at the depletion region, the thermal noise can be reduced by carefully choosing $V_G = V_T$, which can make the thermal noise as low as $10^{-22}$ A/Hz. The reduced exponential factor with improved crystalline quality semiconductors may allow a higher speed operation of the TTOFET detectors.

In addition to the high sensitivity, a large active area is useful to record the light emission from bulky scintillators. In some implementations, a low-cost light waveguide concentrator—a simple coated quartz glass—can be used to collect light from the scintillator. In addition to the low cost, such a light concentrator enables a compact integration of bulky scintillators with the photodetector, and is more robust compared to other mirror based concentrators. A slit can be etched on the center of the quartz glass by chemical etching (e.g. using hydrofluoric acid), where the TTOFET photodetector is located. Since the refractive index of the organic materials (~1.7) used in the TTOFET is higher than quartz, the trapped light is efficiently coupled into the TTOFET photodetector. To prevent light loss, the edge of light trapping waveguide glass and the scintillator crystal can be wrapped with a highly reflective white film. One major merit of this light-trapping structure is that it can be easily scaled up from a few $cm^2$ to 1,000 $cm^2$ with a very low cost.

For example, the waveguide concentrator can be a flat quartz covered with organic fluorescent dyes (e.g. polyfluorene derivatives) or inorganic phosphors such as $LaMgAl_{11}O_{19}$:Ce and $BaSi_2O_5$:Pb which have a high quantum yield (above 90%). These dyes or phosphors can convert the incident short wavelength UV (UVB) from scintillators, for example, 303 nm from NaI:Ce, into relative longer wavelength UV-blue light UVA, 350 nm for polyfluorenes. The re-emitted light goes all directions and thus redirects the incident light so that more light can be trapped by the waveguide. Due to total reflection effect, most of the light will be trapped in the glass waveguide. The ratio of the trapped light ($\eta_{tr}$) is $\eta_{tr}=\sqrt{1-(n_2/n_1)^2}$, where the $n_1$ is the refractive index of the DC UV glass (—1:55) and the $n_2$ is the refractive index of air (1.0). The trapping efficiency can be about 80%.

Other embodiments are within the scope of the following claims. For example, the p-type C8-BTBT material in the photodetector 310 can be replaced by an n-type semiconductor material that is sensitive to light and can trap charges.

What is claimed is:

1. A method comprising:
   applying a voltage difference between a source electrode and a drain electrode, and applying a bias voltage to a gate electrode, to cause an electric current to flow from the source electrode through a channel to the drain electrode;
   generating one or more electric charges by using a light-absorbing material to absorb light and generate the one or more electric charges;
   trapping the one or more electric charges within the light-absorbing material; and
   reducing the current flowing in the channel by using the trapped one or more electric charges in the light-absorbing material to influence charge carriers in the channel.

2. The method of claim 1 in which the channel comprises a P-type semiconductor, and the bias voltage applied to the gate electrode comprises a negative voltage.

3. The method of claim 2, comprising counting a number of photons that have been detected based on a change in the current flowing through the channel.

4. The method of claim 1 in which the channel comprises an N-type semiconductor, and the bias voltage applied to the gate electrode comprises a positive voltage.

5. A method comprising:
   providing a field effect transistor photodetector that comprises a source electrode, a drain electrode, a channel comprising a light-absorbing material, a gate electrode, and a dielectric layer disposed between the gate electrode and the channel;
   applying a voltage difference between the source and drain electrodes;
   applying a bias voltage to the gate electrode, in which initially negligible current flows in the channel when the bias voltage is applied to the gate electrode;
   generating one or more electric charges in the channel by using the light-absorbing material in the channel to absorb light and generate the one or more electric charges;
   confining the one or more electric charges in the channel; and
   increasing a current flowing in the channel upon confining the charges in the channel.

6. The method of claim 5 in which providing a channel comprises providing a channel that comprises C8-BTBT.

7. The method of claim 5, comprising sensing a change in the current flowing in the channel when the photodetector detects one or more photons.

8. The method of claim 7, comprising determining an amount of photons detected based on the sensed change in the channel current.

* * * * *